US009076938B2

(12) United States Patent
Mineshita

(10) Patent No.: US 9,076,938 B2
(45) Date of Patent: Jul. 7, 2015

(54) SEMICONDUCTOR LIGHT-EMITTING DEVICE

(71) Applicant: ROHM CO., LTD., Kyoto-shi, Kyoto (JP)

(72) Inventor: Kentaro Mineshita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/518,094

(22) Filed: Oct. 20, 2014

(65) Prior Publication Data

US 2015/0034993 A1     Feb. 5, 2015

Related U.S. Application Data

(63) Continuation of application No. 13/872,498, filed on Apr. 29, 2013, now Pat. No. 8,884,324.

(30) Foreign Application Priority Data

May 9, 2012 (JP) ................................. 2012-107614
Apr. 2, 2013 (JP) ................................. 2013-76925

(51) Int. Cl.
| | |
|---|---|
| *H01L 33/00* | (2010.01) |
| *H01L 33/58* | (2010.01) |
| *H01L 33/48* | (2010.01) |
| *H01L 33/62* | (2010.01) |
| *H01L 23/00* | (2006.01) |
| *H01L 33/54* | (2010.01) |

(52) U.S. Cl.
CPC .............. *H01L 33/58* (2013.01); *H01L 33/486* (2013.01); *H01L 33/54* (2013.01); *H01L 33/62* (2013.01); *H01L 24/97* (2013.01); *H01L 2224/48091* (2013.01); *H01L 2924/12041* (2013.01)

(58) Field of Classification Search
CPC ........ H01L 33/58; H01L 33/486; H01L 33/62; H01L 24/97
USPC ...................................................... 257/98, 99
See application file for complete search history.

(56) References Cited

U.S. PATENT DOCUMENTS 8,106,859 B2 * 1/2012 Ohkawa et al. ................. 345/82
8,674,488 B2     3/2014 Wai et al.

FOREIGN PATENT DOCUMENTS

JP     2009-21472     1/2009

* cited by examiner

*Primary Examiner* — Tu-Tu Ho
(74) *Attorney, Agent, or Firm* — Hamre, Schumann, Mueller & Larson, P.C.

(57) ABSTRACT

A semiconductor light-emitting device includes a substrate, an LED chip mounted on the substrate, and a resin package covering the LED chip. The substrate includes a base and a wiring pattern formed on the base. The resin package includes a lens. The base includes an upper surface, a lower surface and a side surface extending between the upper surface and the lower surface. The LED chip is mounted on the upper surface of the base. The side surface of the base is oriented in a lateral direction. The wiring pattern includes a pair of first mount portions and a pair of second mount portions. The paired first mount portions are formed on the lower surface of the base. The paired second mount portions are oriented in the lateral direction and offset from the side surface of the base in the lateral direction.

30 Claims, 24 Drawing Sheets

SEMICONDUCTOR LIGHT-EMITTING DEVICE

This application is a Continuation of U.S. Ser. No. 13/872,498, filed Apr. 29, 2013, which application as incorporated herein by reference.

BACKGROUND OF THE INVENTION

1. Field of the Invention

The present invention relates to a semiconductor light-emitting device that includes an LED chip as the light source.

2. Description of the Related Art

Conventionally, various semiconductor light-emitting devices that use LED (light-emitting diode) chips as the light sources are known. An example of semiconductor light-emitting device is disclosed in JP2009-21472. The semiconductor light-emitting device shown in FIGS. 1-5 of this document includes a pair of leads, an LED chip and a resin package. Each of the leads has a portion exposed from the resin package, and the exposed portion includes a mount portion and a connecting portion. Each mount portion includes a portion extending perpendicularly to the optical axis (mount portion 11A, 11B) and a portion extending along the optical axis (mount portion 12A, 12B). The mount portion and the connecting portion are formed by bending the exposed portion of the lead a plurality of times.

According to the conventional technique of bending a lead a plurality of times, it is relatively difficult to make each mount portion at a desired position or into a desired angle. Thus, the conventional semiconductor light-emitting device tends to require a high manufacturing cost. Moreover, in the conventional semiconductor light-emitting device, the mount portion is spaced away from the resin package. Thus, there is still room for improvement regarding size reduction of the semiconductor light-emitting device.

SUMMARY OF THE INVENTION

The present invention has been conceived under the above-described circumstances. It is therefore an object of the present invention to realize size reduction of a semiconductor light-emitting device that can be used as either a top view type light source or a side view type light source.

According to an embodiment of the present invention, there is provided a semiconductor light-emitting device comprising a substrate including a base and a wiring pattern formed on the base, an LED chip mounted on the substrate, and a resin package covering the LED chip and including a lens positioned in front of the LED chip. The base includes a first primary surface, a second primary surface and a first side surface. The first primary surface faces a first side in a first direction, and the LED chip is mounted on the first primary surface. The second primary surface faces a second side opposite to the first side in the first direction and is parallel to the first primary surface. The first side surface is connected to both of the first primary surface and the second primary surface and faces a first side in a second direction perpendicular to the first direction. The wiring pattern includes a pair of first mount portions and a pair of second mount portions. The paired first mount portions are formed on the second primary surface and spaced apart from each other in a third direction perpendicular to both of the first direction and the second direction. The paired second mount portions face the first side in the second direction, are positioned on the first side of the first side surface in the second direction and are spaced apart from each other in the third direction.

Preferably, the resin package includes a foundation portion positioned closer to the substrate than the lens is.

Preferably, the foundation portion includes an end surface spaced away from the substrate toward the first side in the first direction. The length from the second primary surface to the end surface of the foundation portion is not less than one half the length from the second primary surface to the center of the lens.

Preferably, the foundation portion includes a first foundation portion side surface that is flush with the first side surface of the base.

Preferably, the thickness of the foundation portion in the first direction is larger than the thickness of the base in the first direction.

Preferably, the center of gravity of an entirety including the substrate, the LED chip and the resin package is closer to the substrate than the middle point between the second primary surface and the top of the lens is.

Preferably, the base includes a second side surface facing a second side in the second direction and parallel to the first side surface. As viewed in the first direction, the center of the lens is offset in the second direction from the middle point between the first side surface and the second side surface.

Preferably, the base includes a second side surface facing a second side in the second direction and parallel to the first side surface. The foundation portion includes a second foundation portion side surface parallel to the first foundation portion side surface.

Preferably, the second foundation portion side surface is flush with the second side surface of the base.

Preferably, the wiring pattern includes a pair of bonding portions formed on the first primary surface. The LED chip is mounted on one of the bonding portions. Each of the bonding portions is electrically connected to a respective one of the first mount portions.

Preferably, the base includes a third side surface and a fourth side surface facing a first side and a second side, respectively, in the third direction and parallel to each other. The wiring pattern includes a pair of detour portions connected to both of the first mount portions and the bonding portions and formed on the third side surface and the fourth side surface, respectively.

Preferably, the paired detour portions cover ends of the third side surface and the fourth side surface which are closer to the first side surface on the first side in the second direction. The paired first mount portions cover an end of the second primary surface on the first side in the second direction.

Preferably, the paired detour portions cover the third side surface and the fourth side surface at a region from an end on the first side in the second direction to an end on the second side in the second direction, and the paired first mount portions cover the second primary surface at a region from an end on the first side in the second direction to an end on the second side in the second direction.

Preferably, the wiring pattern includes a conductive layer formed on the base, and a plating layer covering at least part of the conductive layer.

Preferably, each of the detour portions and the first mount portions comprises the conductive layer and the plating layer formed on the conductive layer.

Preferably, a first end surface of the conductive layer providing the detour portion, which is an end surface on the first side in the second direction, and a second end surface of the conductive layer providing the first mount portion, which is an end surface on the first side in the second direction, are covered by the plating layer.

Preferably, the first end surface and the second end surface are flush with the first side surface, and the second mount portion includes the plating layer covering the first end surface and the second end surface.

Preferably, an edge of the plating layer covering the first end surface and the second end surface covers the first side surface.

Preferably, the conductive layer contains Cu.

Preferably, the paired bonding portions comprise a first bonding portion including a first extension extending from the first side toward the second side in the third direction and a second bonding portion including a second extension extending from the second side toward the first side in the third direction. The LED chip is mounted on the first extension.

Preferably, the length of the first extension in the second direction is not less than one half the length of the base in the second direction.

Preferably, the first extension includes a first opening positioned on the first side of the LED chip in the third direction and penetrating in the first direction.

Preferably, the first extension includes a first projection overlapping the LED chip as viewed in the third direction and projecting toward the second side in the third direction. The length from the LED chip to a front end of the first projection on the second side in the third direction is not less than the length of the LED chip in the second direction.

Preferably, the first extension includes a second projection projecting from each end in the second direction toward the second side in the third direction.

Preferably, the front end of the second projection on the second side in the third direction is on the second side of the front end of the first projection in the third direction.

Preferably, the semiconductor light-emitting device according to the present invention further comprises a wire connecting the LED chip and the second extension.

Preferably, the second extension is spaced apart from the LED chip as viewed in the third direction.

Preferably, the semiconductor light-emitting device according to the present invention further comprises a resist film interposed between the first and the second bonding portions and the resin package. The resist film includes a second opening that exposes part of the first bonding portion. The first extension includes a portion exposed through the second opening, and the LED chip is mounted on this portion of the first extension.

Preferably, the lens includes an optical axis extending in the first direction and an aspheric surface of which curvature reduces as proceeding from the center toward the periphery.

Preferably, the lens has a diameter not less than six times the length of a side of the LED chip as viewed in the first direction.

Other features and advantages of the present invention will become more apparent from detailed description given below with reference to the accompanying drawings.

DESCRIPTION OF THE PREFERRED EMBODIMENTS

Figure 1:
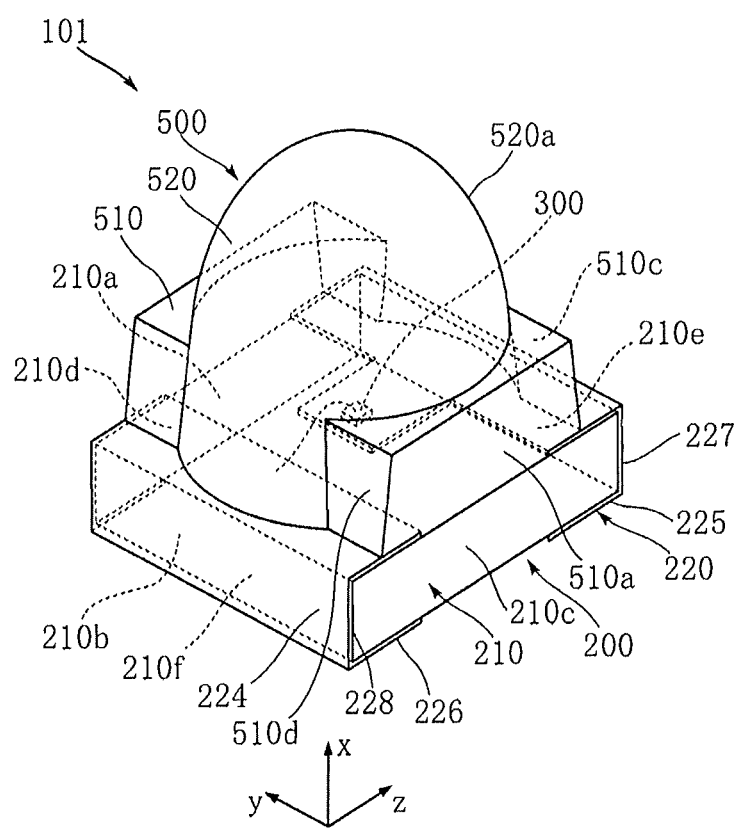
FIG. 1 is a perspective view of a semiconductor light-emitting device according to a first embodiment of the present invention.

Preferred embodiments of the present invention are described below with reference to the accompanying drawings.

FIGS. 1-10 show a semiconductor light-emitting device according to a first embodiment of the present invention. The illustrated semiconductor light-emitting device 101 includes a substrate 200, an LED chip 300, a wire 400 and a resin package 500.

Figure 2:
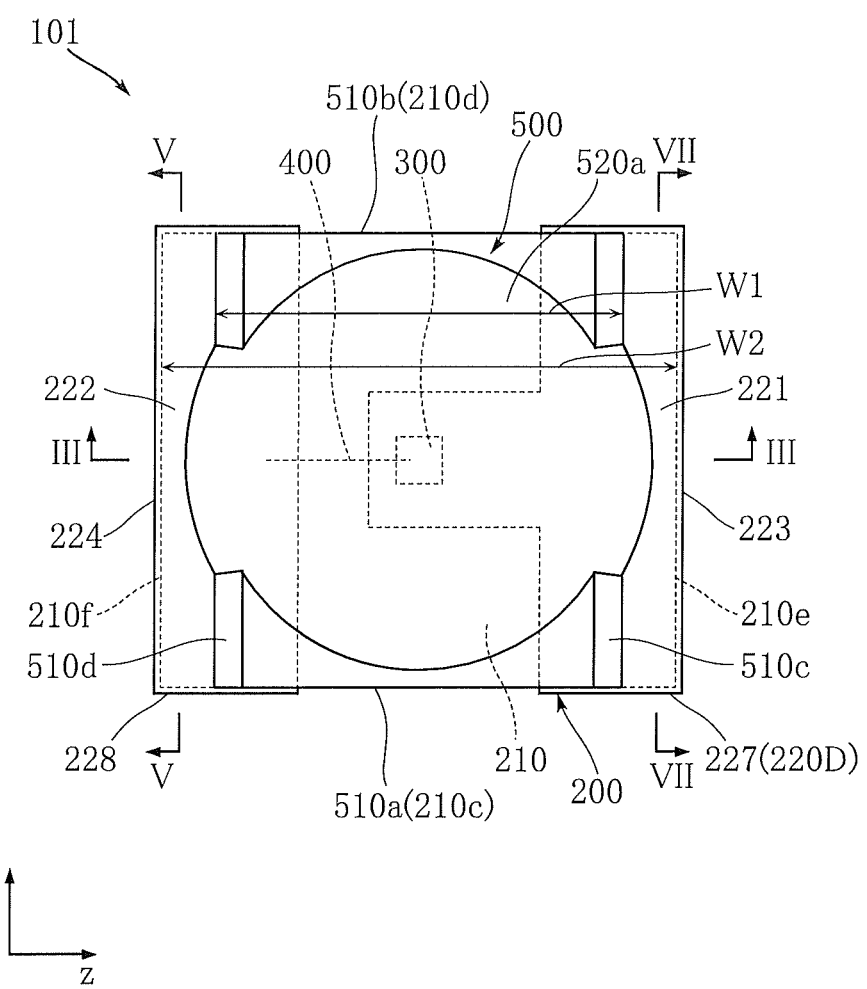
FIG. 2 is a plan view showing the semiconductor light-emitting device of FIG. 1.
Figure 3:
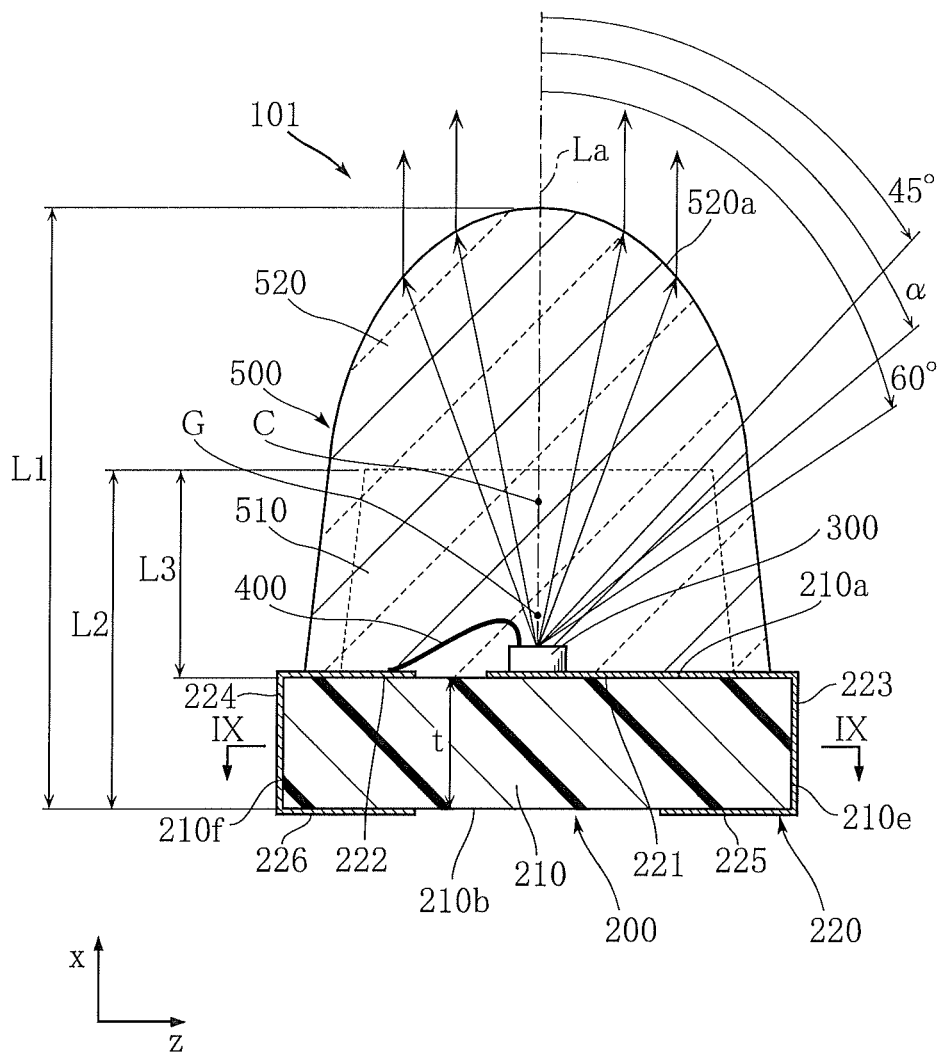
FIG. 3 is a sectional view taken along lines III-III in FIG. 2.

As shown in FIGS. 1-3, the substrate 200 includes a base 210 and a wiring pattern 220 formed on the base 210.

The base 210 is in the form of a rectangular parallelepiped and made of e.g. glass epoxy resin. The base 210 has an upper surface 210a and a lower surface 210b which are parallel to each other. The base 210 further includes a side surface 210c and a side surface 210d which are parallel to each other, and a side surface 210e and a side surface 210f which are parallel to each other. The upper surface 210a is a flat surface facing a first side in the direction x, and the lower surface 210b is a flat surface facing a second side in the direction x. The side surface 210c is a flat surface facing a first side in the direction y, and the side surface 210d is a flat surface facing a second side in the direction y. The direction y is perpendicular to the direction x. The side surface 210e is a flat surface facing a first side in the direction z, and the side surface 210f is a flat surface facing a second side in the direction z. The direction z is perpendicular to both of the direction x and the direction y. Each side surface 210c, 210d is in the form of a rectangle elongated in the direction z. Each side surface 210e, 210f is in the form of a rectangle elongated in the direction y. The length of the base 210 in the direction z is longer than the length of the base 210 in the direction y. For instance, the base 210 is about 2.9 mm in length in the direction z, about 2.5 mm in length in the direction y and about 0.7 mm in thickness.

The wiring pattern 220 is made of a metal such as Cu, Ni, Ag or Au. As shown in FIGS. 1-3, the wiring pattern 220 includes bonding portions 221, 222, detour portions 223, 224, and mount portions 225, 226, 227, 228. The bonding portions 221 and 222 are provided on the upper surface 210a of the base 210. On the bonding portion 221 is bonded the LED chip 300. The detour portions 223 and 224 are connected to the bonding portions 221 and 222, respectively and provided on the side surfaces 210e, 210f of the base 210. The mount portions 225 and 226 are provided on the lower surface 210b of the base 210 and spaced apart from each other in the direction z. The mount portions 225 and 226 are connected to the detour portions 223 and 224, respectively. The mount portions 227 and 228 face the first side in the direction y. The mount portions 225, 226 and the mount portions 227, 228 are used for mounting the semiconductor light-emitting device 101 on e.g. a circuit board. The mount portions 225 and 226 are used for surface-mounting the light-emitting device in such a manner that the lower surface 210b faces the circuit board. The detailed structure of the wiring pattern 220 is described later.

The LED chip 300 shown in FIG. 3 includes a quaternary semiconductor layer made up of an n-type semiconductor layer made of e.g. AlGaInP, an active-layer and a p-type semiconductor layer arranged one on top of another, and emits e.g. orange light. Two electrodes are provided on the LED chip 300. One of the electrodes is provided on the lower surface and bonded to the bonding portion 221 via conductive paste. The other one of the electrodes is provided on the upper surface. An end of the wire 400 is bonded on this electrode. Another end of the wire 400 is bonded on the bonding portion 222. In this embodiment, only one wire 400 is bonded on the LED chip 300 (so-called single wire type). For instance, the LED chip 300 is in the form of a square having a size of 260×260 μm as viewed in the direction x, and has a thickness of about 170 μm. The LED chip 300 may be of the type that emits green light, including a semiconductor layer made of InGaN, or of the type that emits blue light.

As shown in FIGS. 1-3, the resin package 500 covers the LED chip 300 and the upper surface 210a of the base 210. The resin package 500 is made of e.g. an epoxy resin or silicone resin that transmits light from the LED chip 300. The resin package 500 includes a foundation portion 510 and a dome-shaped portion 520. The dome-shaped portion 520 bulges toward the first side in the direction x and has a lens 520a close to the top end of the dome-shaped portion 520. The lens 520a is positioned to face the LED chip 300 and has an optical axis La extending in the direction x. The lens 520a is provided for increasing directivity of the light from the LED chip 300. In this embodiment, the lens 520a has an aspheric surface, and the curvature reduces as proceeding from the center toward the periphery.

The foundation portion 510 is closer to substrate 200 than the lens 520a is and sandwiches the dome-shaped portion 520 from opposite sides in the direction y. The foundation portion 510 has side surfaces 510a, 510b, 510c and 510d. The side surface 510a is a flat surface facing the first side in the direction y and flush with the side surface 210c of the base 210, as shown in FIG. 2. The side surface 510b is a flat surface facing the second side in the direction y and flush with the side surface 210d of the base 210. The side surfaces 510c and 510d are connected to both of the side surfaces 510a and 510b and inclined with respect to x-y plane. In this embodiment, the side surfaces 510c and 510d are inclined to become further away from the LED chip 300 as viewed in the direction x as proceeding toward the base 210 (proceeding toward the second side in the direction x). The width W1 of the foundation portion 510 in the direction z at the contact interface area with the substrate 200 (wiring pattern 220) is smaller than the width W2 of the substrate 200 in the direction z. Thus, the wiring pattern 220 (bonding portions 221, 222) on the upper surface 210a of the base 210 is exposed from the foundation portion 510 at the ends in the direction z.

For instance, the dimensions of the semiconductor light-emitting device 101 in the direction x may be (see FIG. 3) about 3.3 mm in length L1 from the lower surface 210b of the base 210 to the center of the lens 520a, and about 1.7 mm in length L2 from the lower surface 210b to the end of the foundation portion 510 on the first side in the direction x. The length L2 is set to be not less than one half the length L1. As shown in FIG. 3, the thickness L3 of the foundation portion 510 in the direction x is larger than the thickness t of the base 210 in the direction x. The larger the thickness L3 of the foundation portion 510 is, the more stable the posture of the light-emitting device is when the light-emitting device is mounted as a side-view type. On the other hand, in view of the directivity of the lens 520a, the thickness L3 of the foundation portion 510 is set in such a manner that light having a predetermined angle α from the center of the upper surface of the LED chip 300 does not impinge on the foundation portion 510. For instance, the angle α is 55°. However, the angle is not limited to this and may be set in the range of 45-60°. Further, in this embodiment, as shown in FIG. 3, when the center of gravity of the entirety including the substrate 200, the LED chip 300 and the resin package 500 is expressed as "G", and the middle point between the lower surface 210b of the base 210 and the top of the lens 520a is expressed as "C", the gravity G is closer to the substrate 200 than the middle point C is.

Figure 9:
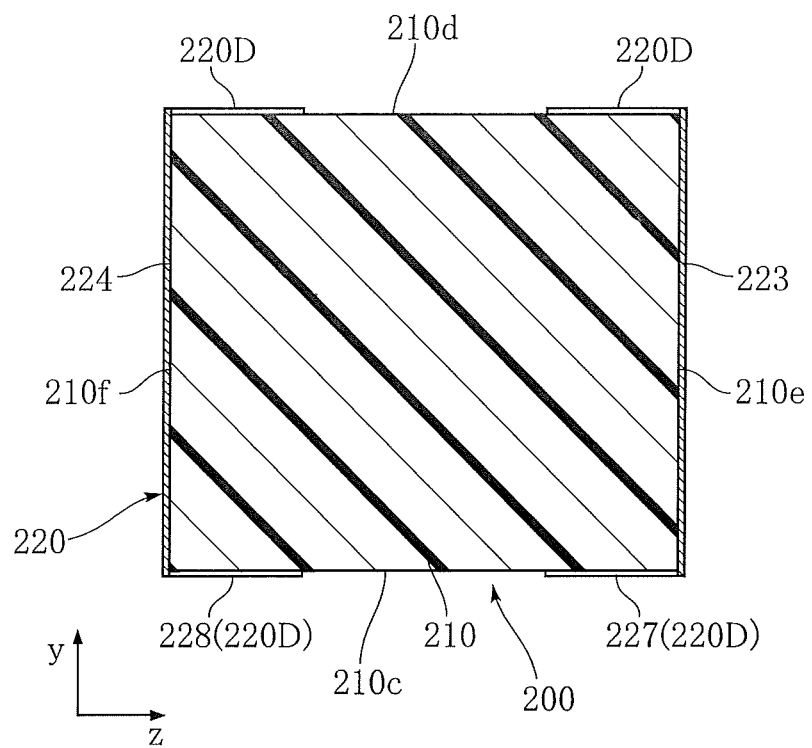
FIG. 9 is a sectional view taken along lines IX-IX in FIG. 3.

As will be understood from FIGS. 1, 2 and 9, in the wiring pattern 220 of this embodiment, each of the detour portions 223 and 224 covers the range extending from the end on the first side (closer to the side surface 210c) to the end on the second side in the direction y. As will be understood from FIGS. 1, 5 and 7, each of the mount portions 225 and 226 covers the range extending from the end on the first side to the end on the second side in the direction y. Each of the bonding portions 221 and 222 includes a portion that covers the range extending from the end on the first side to the end on the second side in the direction y.

Figure 4:
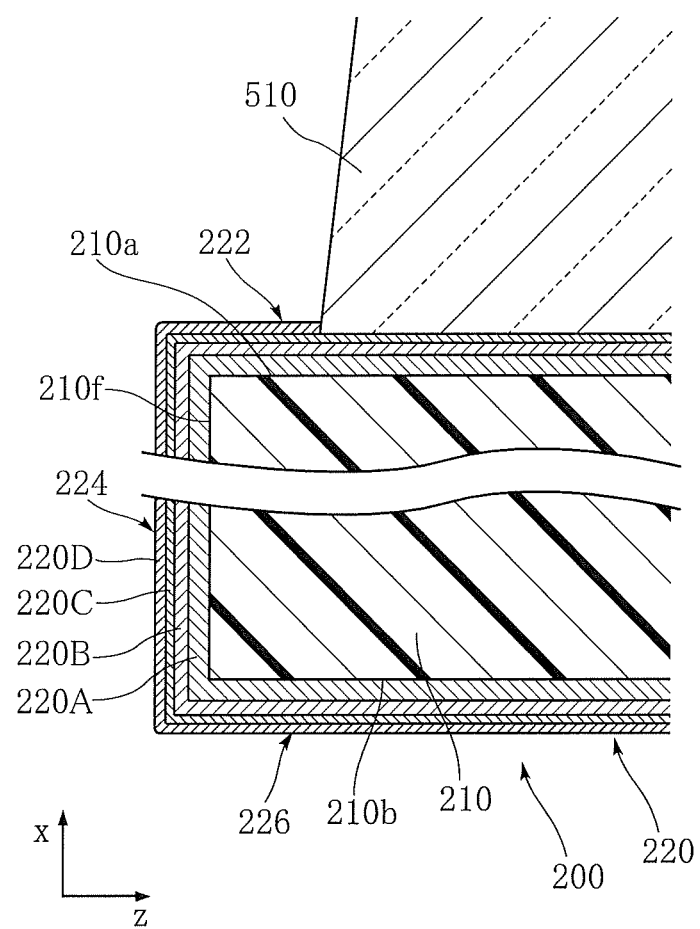
FIG. 4 is a schematic enlarged view of FIG. 3.
Figure 5:
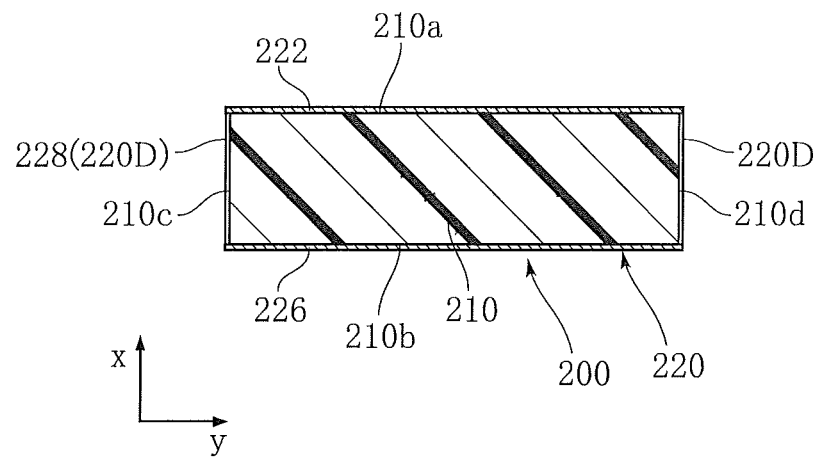
FIG. 5 is a sectional view taken along lines V-V in FIG. 2.
Figure 6:
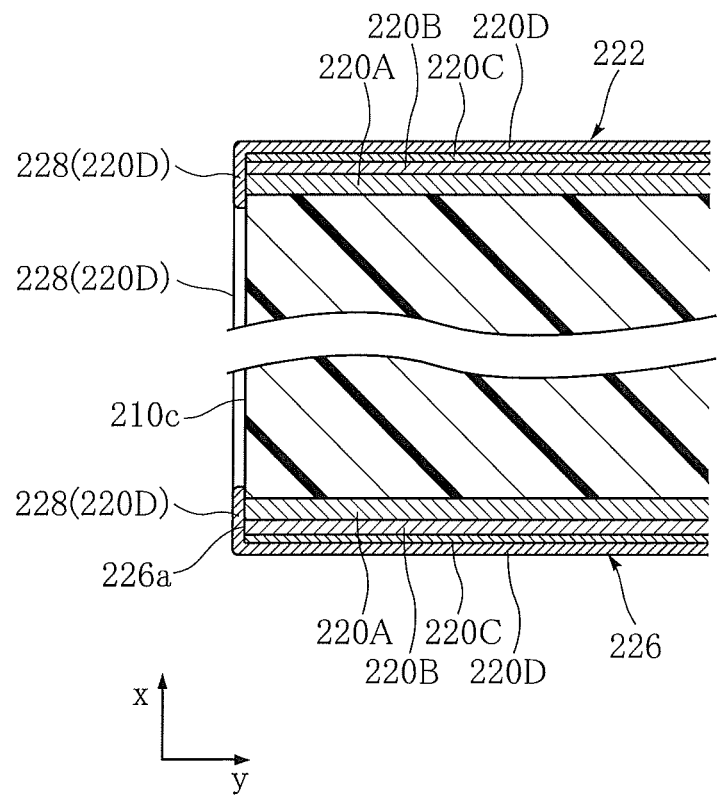
FIG. 6 is a schematic enlarged view of FIG. 5.
Figure 7:
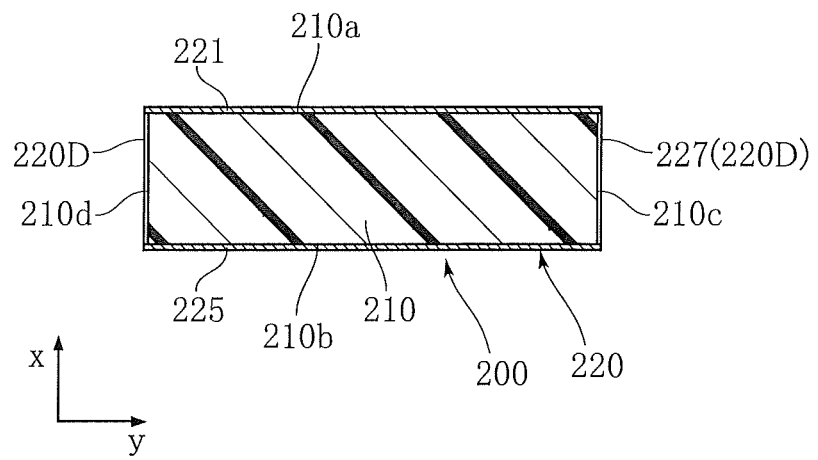
FIG. 7 is a sectional view taken along lines VII-VII in FIG. 2.
Figure 8:
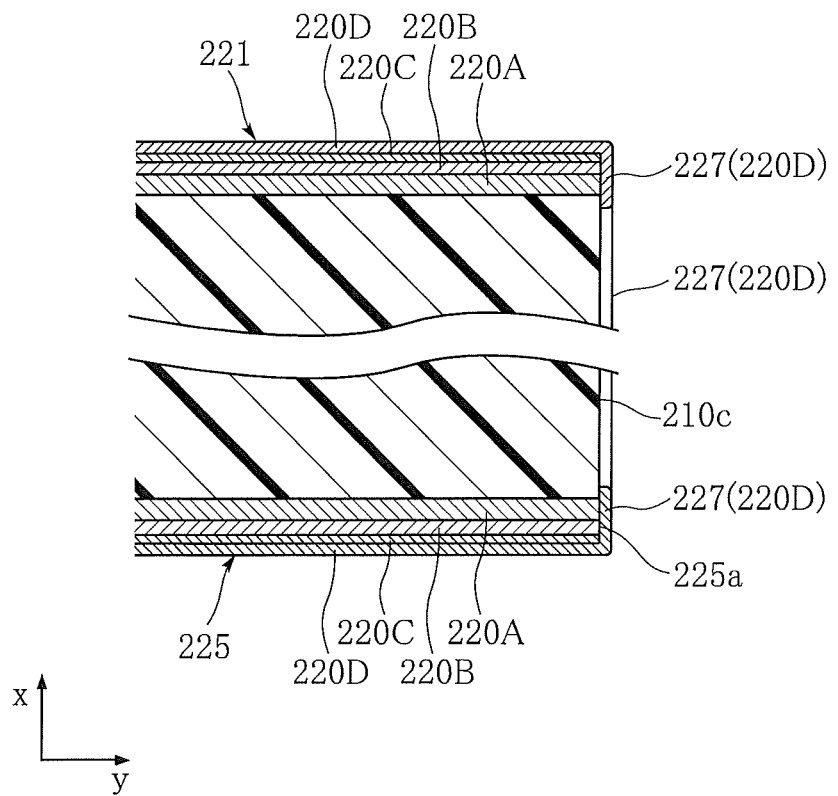
FIG. 8 is a schematic enlarged view of FIG. 7.
Figure 10:
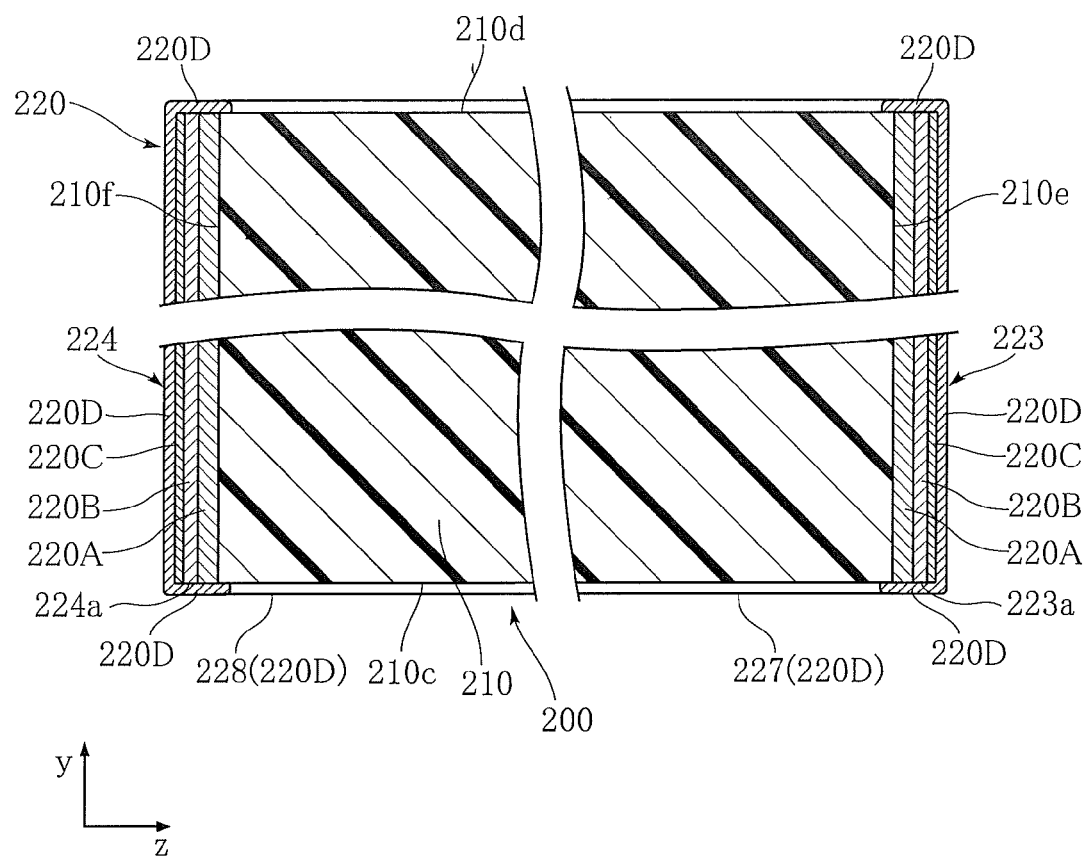
FIG. 10 is a schematic enlarged view of FIG. 9.

The wiring pattern 220 is made up of conductive layers and a plating layer arranged on the conductive layers. In this embodiment, as shown in FIGS. 4, 6, and 10, the wiring pattern 220 is made up of conductive layers 220A, 220B, 220C and a plating layer 220D arranged one on top of another. For instance, the conductive layer 220A is made of Cu, the conductive layer 220B is made of Ni, the conductive layer 220C is made of Au, and the plating layer 220D is made of Sn.

The plating layer 220D covers the conductive layers at portions that are not covered by the resin package 500.

Specifically, as will be understood from FIGS. 3, 4, 9 and 10, each detour portion 223, 224 is made up of the conductive layers 220A, 220B, 220C and the plating layer 220D arranged one on top of another. As will be understood from FIGS. 9 and 10, the end surfaces 223a, 224a of the conductive layers 220A, 220B, 220C, which constitute the detour portions 223, 224, on the first side in the direction y are flush with the side surface 210c of the base 210. The end surfaces 223a, 224a are covered by plating layers 220D, and the plating layers 220D covering the end surfaces 223a, 224a provide the mount portions 227, 228. As will be understood from FIGS. 5-8, each mount portion 225, 226 is made up of conductive layers 220A, 220B, 220C and a plating layer 220D arranged one on top of another. The end surfaces 225a, 226a of the conductive layers 220A, 220B, 220C, which constitute the mount portions 225, 226, on the first side in the direction y are flush with the side surface 210c of the base 210. The end surfaces 225a, 226a are covered by the plating layers 220D, and the plating layers 220D covering the end surfaces 225a, 226a provide the mount portions 227, 228. The edge of the plating layers 220D covering the end surface 225a, 226a, projects by a small amount onto the side surface 210c, to cover part of the edge of the side surface 210c. In this embodiment, the plating layers 220D providing the mount portions 227, 228 is formed so as to substantially avoid the side surface 210c. Thus, the side surface 210c is exposed from the mount portions 227, 228 generally entirely.

Examples of the thickness of each layer of the wiring pattern 220 are as follows. The thickness of the conductive layer 220A may be about 20 μm, the thickness of the conductive layer 220B may be about 10 μm, the thickness of the conductive layer 220C may be about 0.2 μm, and the thickness of the plating layer 220D may be about 8 μm. In FIGS. 2, 5, 7 and 9, the thickness of the plating layer 220D is shown as exaggerated.

The end on the first side (closer to the side surface 210c) of the wiring pattern 220 in the direction y is exposed to have a C-shape made up of three straight portions and projects to the first side in the direction y from the side surface 210c by the amount corresponding to the thickness of the plating layer 220D. The portion of the wiring pattern 220 that faces the first side in the direction y and positioned on the first side of the side surface 210c in the direction y provides the mount portion 227, 228. The mount portions 227 and 228 are spaced apart from each other in the direction z. The mount portions 227 and 228 are used for surface-mounting the light-emitting device in such a manner that the side surface 210c faces a circuit board.

Figure 11:
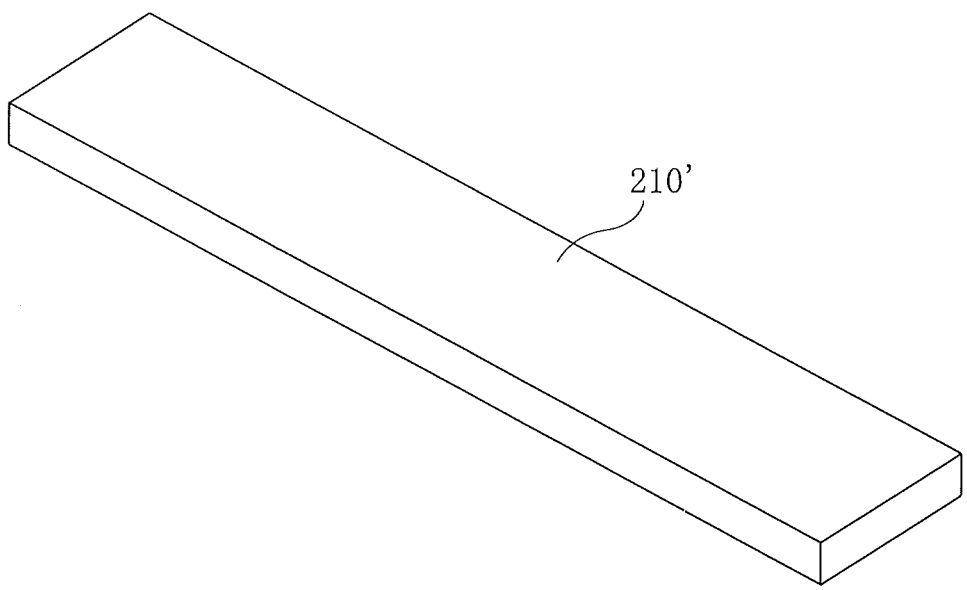
FIG. 11 is a perspective view showing a step of process for making the semiconductor light-emitting device of FIG. 1.
Figure 12:
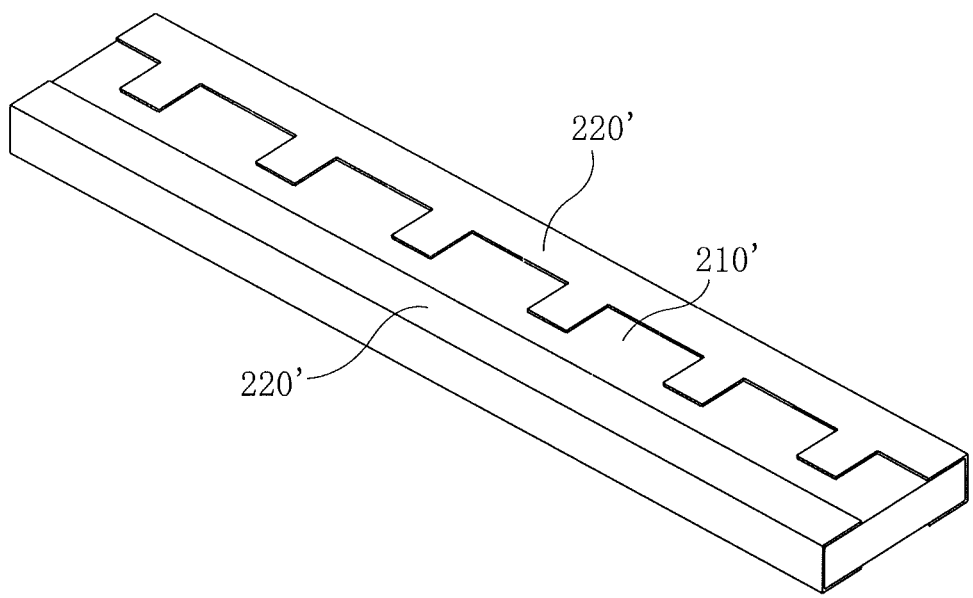
FIG. 12 is a perspective view showing a step subsequent to FIG. 11.
Figure 13:
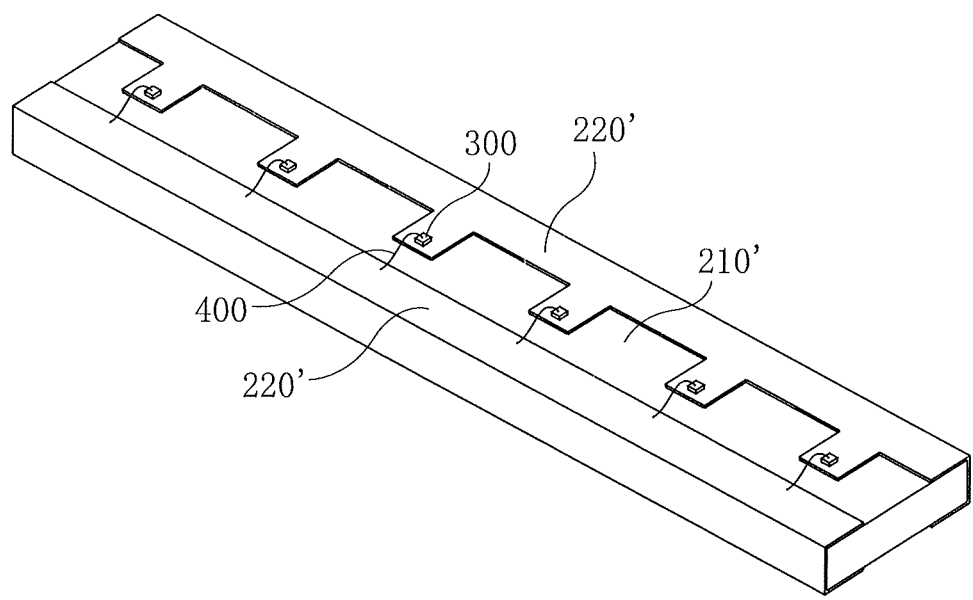
FIG. 13 is a perspective view showing a step subsequent to FIG. 12.
Figure 14:
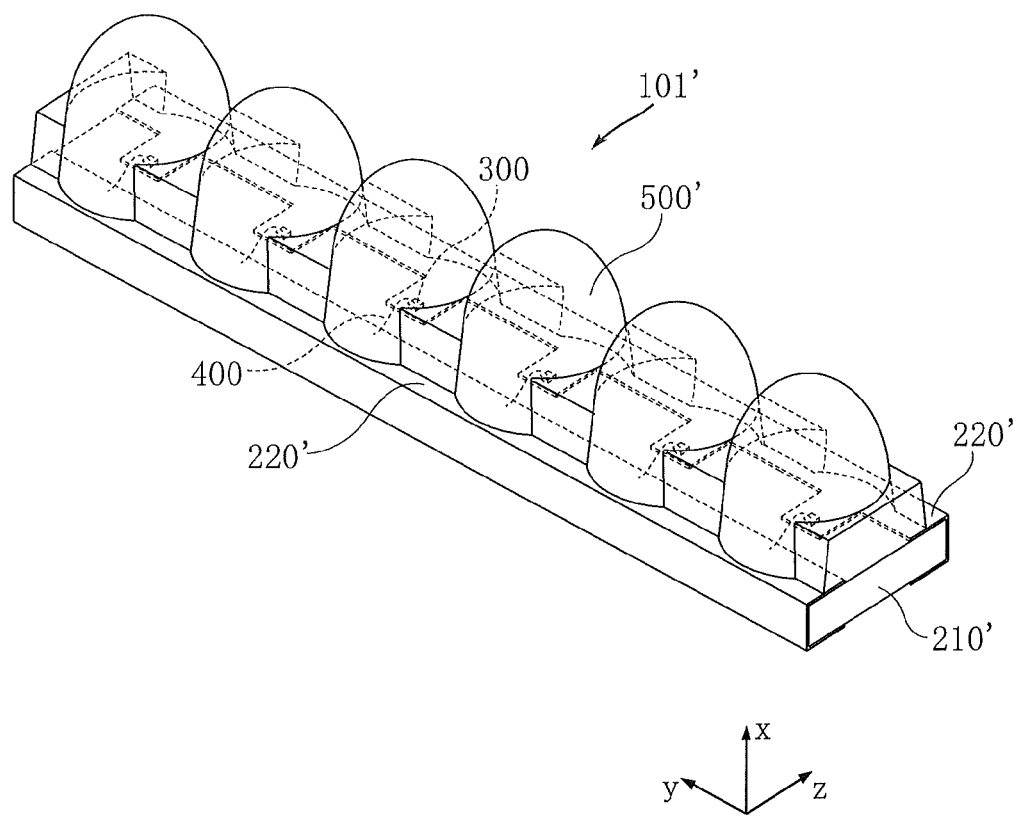
FIG. 14 is a perspective view showing a step subsequent to FIG. 13.

A process for making the semiconductor light-emitting device 101 is described below with reference to FIGS. 11-14. First, as shown in FIG. 11, a base aggregate board 210' as a material for a base 210 is prepared. The base aggregate board 210' has a cross section extending along x-z plane and is elongated in the direction y like a bar. Then, as shown in FIG. 12, conductor patterns 220' are formed on the base aggregate board 210'. The conductor patterns 220' are formed by laminating metal materials for the conductive layers 220A, 220B, 220C one on top of another, and provided at opposite edges of the base aggregate board 210' in the direction z. Each conductor pattern 220' includes portions to become bonding portions 221, 222, detour portions 223, 224, and mount portions 225, 226 as connected to each other in the direction y. Then, as shown in FIG. 13, LED chips 300 are mounted at predetermined portions of a conductor pattern 220' (at portions corresponding to the bonding portions 221). Then, a wire 400 is bonded to each of the LED chips 300. Then, as shown in FIG. 14, a resin mold 500' is formed on the base aggregate board 210'. The resin mold 500' includes portions to become resin packages 500 as connected to each other in the direction y. In this way, a semiconductor light-emitting device aggregate member 101' (hereinafter referred to as aggregate member 101') is obtained. Then, the aggregate member 101' is cut along x-y plane at predetermined intervals in the direction y, whereby divided members (not shown) are obtained. Each divided member is different from the semiconductor light-emitting device 101 in that it does not include a plating layer 220D. One of the cut end surfaces of the divided member includes an end surface of the base 210 (e.g. side surface 210c), an end surface of the resin package 500 (e.g. side surface 510a of the foundation portion 510), and end surfaces of the conductive layers 220A, 220B, 220C, and these end surfaces are flush with each other. The other one of the cut end surfaces of the divided member includes an end surface of the base 210 (side surface 210d, which is on the opposite side of the side surface 210c in the direction y), an end surface of the resin package 500 (side surface 510b, which is on the opposite side of the side surface 510a in the direction y), and end surfaces of the conductive layers 220A, 220B, 220C, and these end surfaces are flush with each other. Then, a plating layer 220D is formed on the metal exposed portions of the divided member, whereby the semiconductor light-emitting device 101 is obtained.

As a result of this manufacturing process, the portions of the wiring pattern 220 which are on the opposite side of the mount portions 227, 228 (second mount portion) in the direction y project from the side surface 210d to the opposite side in the direction y by the amount corresponding to the thickness of the plating layer 220D. As will be understood from this, the portions of the wiring pattern 220 which are on the opposite side of the mount portions 227, 228 in the direction y have the same structure as that of the mount portions 227, 228. Thus, the portions of the wiring pattern 220 which are on the opposite side of the mount portions 227, 228 in the direction y can be utilized as a second mount portion when the light-emitting device is mounted, with the side surface 210d, which is on the opposite of the side surface 210c in the direction y facing a circuit board.

The advantages of the semiconductor light-emitting device 101 are described below.

Figure 15:
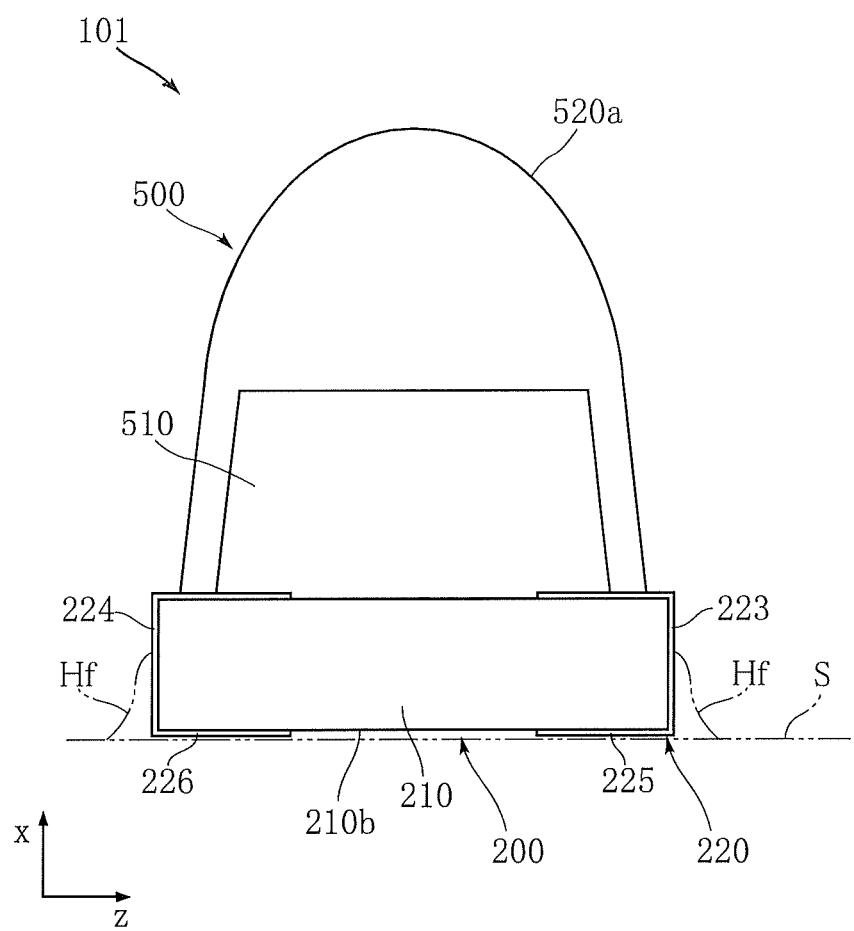
FIG. 15 is a side view showing an example of the state in which the semiconductor light-emitting device of FIG. 1 is mounted on a circuit board.
Figure 16:
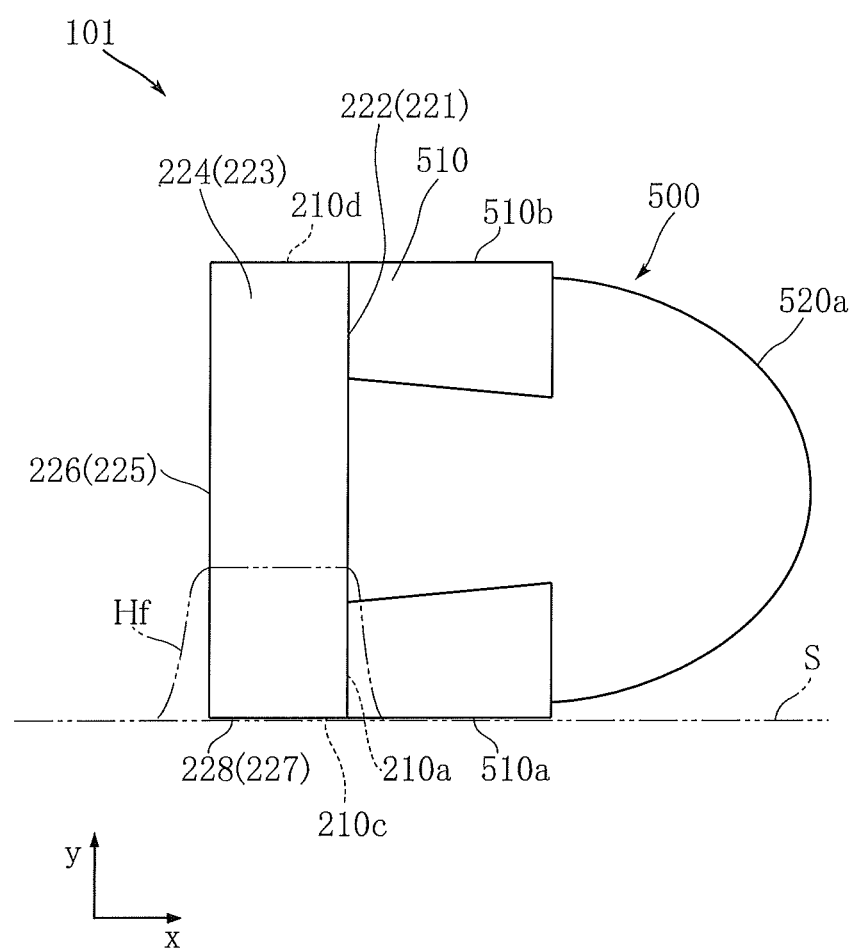
FIG. 16 is a side view showing an example of the state in which the semiconductor light-emitting device of FIG. 1 is mounted on a circuit board.

According to this embodiment, the semiconductor light-emitting device 101 can be surface-mounted on a circuit board. In the case where the mount portions 225 and 226 are used for mounting, the lower surface 210b of the base 210 is oriented toward the circuit board S, as shown in FIG. 15. In this case, the semiconductor light-emitting device 101 is used as a top view type light source that emits light in a direction in which the circuit board S faces. On the other hand, in the case where the mount portions 227 and 228 are used for mounting, the side surface 210c of the base 210 is oriented toward the circuit board S, as shown in FIG. 16. In this case, the semiconductor light-emitting device 101 is used as a side view type light source which emits light in a direction in which the circuit board S extends. For instance, the semiconductor light-emitting device 101 of this embodiment can be used as autofocus assist light of a digital camera.

The mount portions 225, 226 and the mount portions 227, 228 are provided by the wiring pattern 220 in the form of a thin film formed on the base 210. Thus, when the light-emitting device is surface-mounted by using solder, either of the lower surface 210b or the side surface 210c can be brought into close contact with the circuit board S via solder substantially in parallel to the circuit board. This assures that the light-emitting device is mounted in a desired posture on a circuit board S whether it is used as a top view type light source or a side view type light source.

Since the mount portions 225, 226 and the mount portions 227, 228 are provided by the wiring pattern 220, the semiconductor light-emitting device 101 is suitable for size reduction as compared with the structure in which the mount portions are made by bending a metal lead, for example.

The lens 520a is an aspheric lens of which curvature reduces as proceeding from the center toward the periphery. This substantially reduces the size of the lens 520a as viewed in the direction x. This is desirable for size reduction of the semiconductor light-emitting device 101. As will be understood from FIG. 3, according to the aspheric lens having the above-described shape, of the light emitted from the LED chip 300, the light rays having a relatively strong radiant intensity and emitted within a predetermined angle (e.g. about 10°) with respect to the front direction of the LED chip 300 (in the direction of the optical axis La of the lens 520a) travel substantially along the optical axis La of the lens 520a. Thus, according to the semiconductor light-emitting device 101, light having a high intensity can be emitted in the direction of the optical axis La of the lens 520a.

The detour portions 223, 224 and the mount portions 225, 226 are formed on the side surface 210e, 210f or the lower surface 210b in a region from a first end to a second end in the direction y. The surfaces of the detour portions 223, 224 and mount portions 225, 226 are covered by the plating layer 220D. At the ends in the direction z, the bonding portion 221, 222 are formed on the upper surface 210a in a region from a first end to a second end in the direction y. The ends of the bonding portions 221, 222 in the direction z are exposed from the foundation portion 510 and covered by the plating layer 220D (see FIG. 4). The plating layer 220D has good wettability to solder. Thus, as will be understood from FIG. 15, when the light-emitting device is mounted by using the mount portions 225 and 226, solder fillets Hf indicated by phantom lines are formed in such a manner as to cover the detour portions 223 and 224. As will be understood from FIG. 16, when the light-emitting device is mounted by using mount portions 227 and 228, solder fillets Hf indicated by phantom lines are formed in such a manner as to cover the mount portions 225, 226, the detour portions 223, 224 and the bonding portions 221, 222. Thus, the semiconductor light-emitting device 101 has enhanced bonding strength whether it is used as a top view type light source or a side view type light source. This is suitable for keeping the mounted state on the circuit board S in a desired posture. In particular, in the case shown in FIG. 16, the solder fillet Hf can be applied also onto the bonding portions 221,222 on the upper surface 210a of the base 210. This realizes more reliable electrical connection between the semiconductor light-emitting device 101 and the circuit board S.

Although Cu contained in the wiring pattern 220 (conductive layer 220A) is suitably used as a material for the wiring pattern 220, it is oxidized relatively easily. When Cu is oxidized, wettability of solder deteriorates, so that bonding strength between Cu and solder reduces when solder is used for mounting. In this embodiment, however, the end surfaces of the conductive layer 220A are covered by the plating layer 220D. This makes it possible to avoid reduction of the bonding strength in the case where solder is used for mounting.

In the case where the mount portions 227, 228 are used for mounting, the semiconductor light-emitting device 101 is in a laid-down posture (see FIG. 16). This posture may be relatively unstable, with the lens 520a overhanging largely from the mount portions 227, 228. However, the side surface 510a of the foundation portion 510 of the resin package 500 is flush with the side surface 210b of the base 210. This allows the semiconductor light-emitting device 101 to be supported on the circuit board S at a large area by the combination of the side surface 210c of the base 210 and the side surface 510a of the foundation portion 510, which stabilizes the posture in the mounted state. This is advantageous for mounting the semiconductor light-emitting device 101 on a circuit board S in a desired posture.

As described with reference to FIG. 3, the center of gravity G (the center of gravity of the entirety including the substrate 200, the LED chip 300 and the resin package 500) is closer to the substrate 200 than the middle point C (the middle point between the lower surface 210b of the base 210 and the top of the lens 520a) is. With this arrangement, when the semiconductor light-emitting device 101 is mounted in a laid-down posture as shown in FIG. 16, the side surface 210c of the base 210 and the side surface 510a of the foundation portion 510 are made more parallel to the obverse surface of the board S. The height of the side surface 510a of the foundation portion 510 (the thickness t of the foundation portion 510 in the direction x) can be increased in such a manner that the center of gravity G is closer to the lens 520a than the middle point C is. However, in view of the mounting as a top view type shown in FIG. 15, it is preferable for realizing stable mounting that the gravity G is closer to the substrate 200 than the middle point C is.

As described with reference to FIG. 3, the length L2 from the lower surface 210b of the base 210 to the end of the foundation portion 510 on the first side in the direction x is not less than one half the length L1 from the lower surface 210b to the center of the lens 520a. According to this arrangement, when the semiconductor light-emitting device 101 is mounted in a laid-down posture as shown in FIG. 16, only a small proportion of the lens 520a overhangs from the mount portions 227, 228. This is suitable for stabilizing the posture of the semiconductor light-emitting device 101 in the mounted state.

The side surface 210d of the base 210, which is on the opposite side of the side surface 210c in the direction y, and the side surface 510b of the foundation portion 510 are flush with each other. Thus, when the mounting is performed by utilizing the mount portions 227, 228 and by using e.g. a chip mounter, the surface of a relatively wide area made up of the side surface 210d of the base 210 and the side surface 510b of the foundation portion 510 can be utilized as a surface to be sucked. This allows the operation for mounting the semiconductor light-emitting device 101 to be stably performed. Thus, this arrangement is suitable for mounting the semiconductor light-emitting device 101 on the circuit board S in a desired posture.

Figure 17:
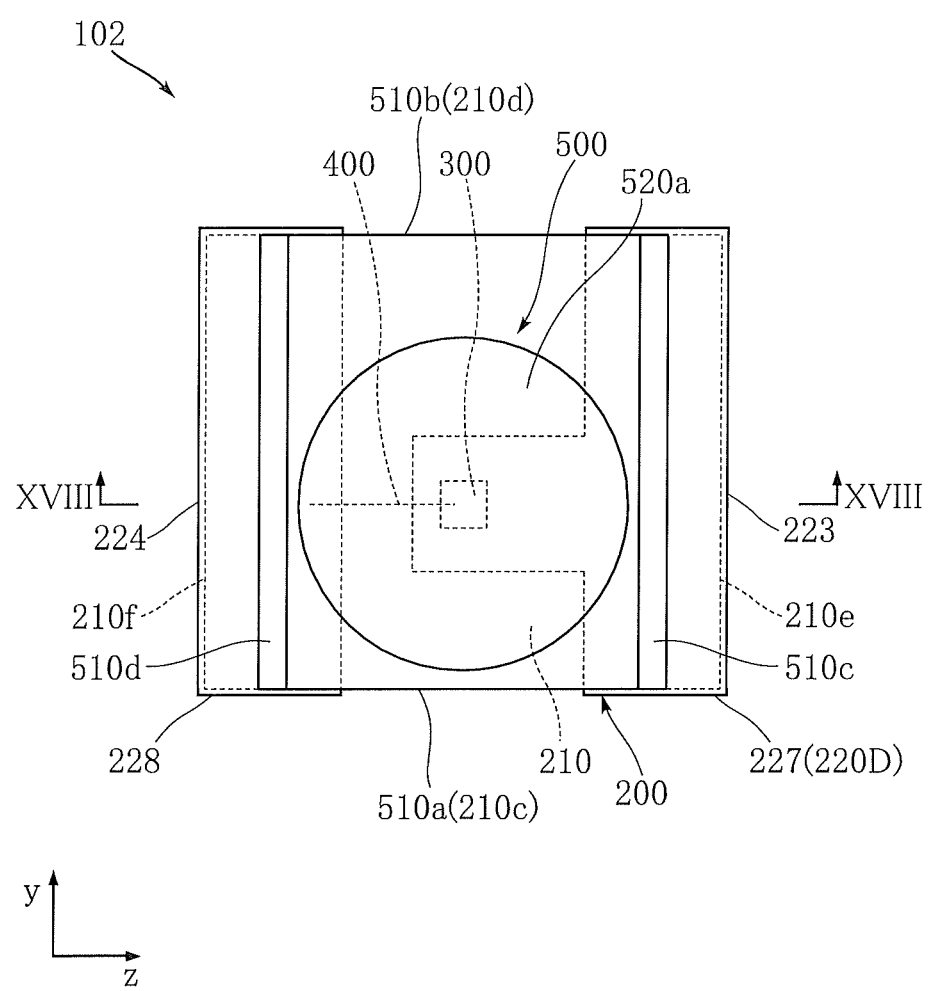
FIG. 17 is a plan view of a semiconductor light-emitting device according to a second embodiment of the present invention.
Figure 18:
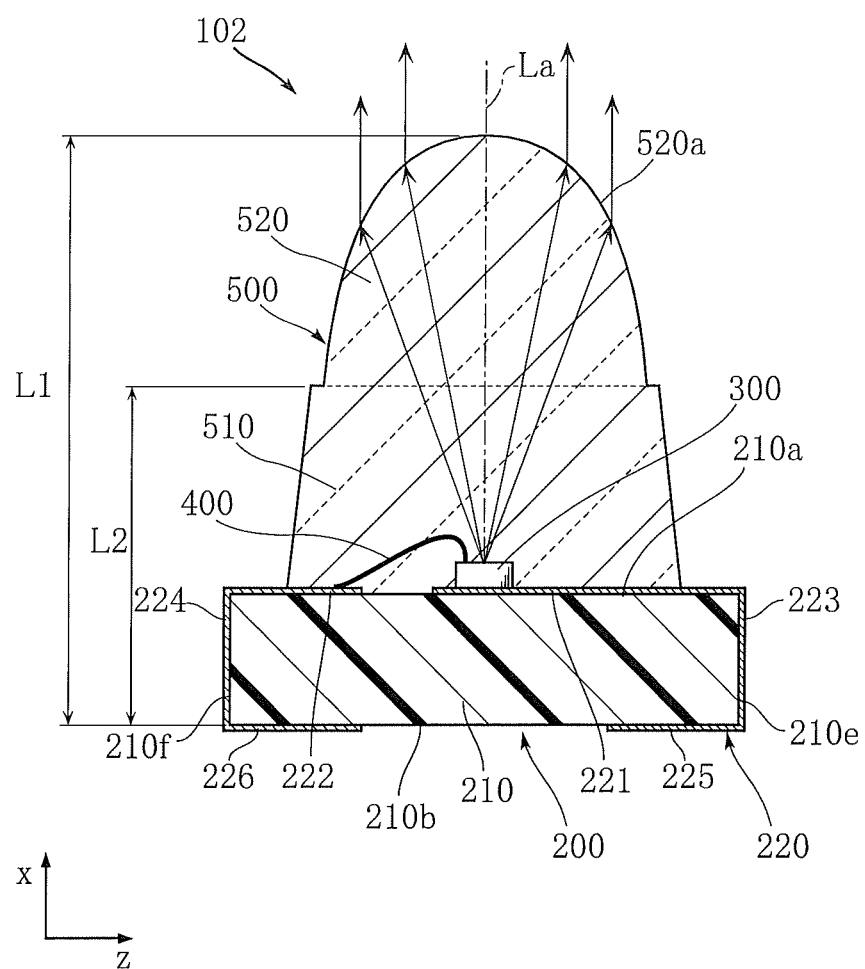
FIG. 18 is a sectional view taken along lines XVIII-XVIII in FIG. 17.

FIGS. 17 and 18 show a semiconductor light-emitting device according to a second embodiment of the present invention. In FIG. 17 and the subsequent drawings, the elements that are identical or similar to those of the first embodiment are designated by the same reference signs as those used for the foregoing embodiment, and the description is omitted appropriately.

As shown in FIG. 17, in the semiconductor light-emitting device 102 of this embodiment, the center of the lens 520a is offset from the middle point between the side surface 210c and the side surface 210d of the base 210 toward one side in the direction y (toward the side surface 210c), as viewed in the direction x. Moreover, in this embodiment, as shown in FIGS. 17 and 18, the dome-shaped portion 520 and the lens 520a are made small, as compared with those of the first embodiment. Note that even in the case where the dome-shaped portion 520 and the lens 520a have the same size or be larger than those the first embodiment, it suffices that the center of the lens 520a is offset toward one side in the direction y.

Figure 19:
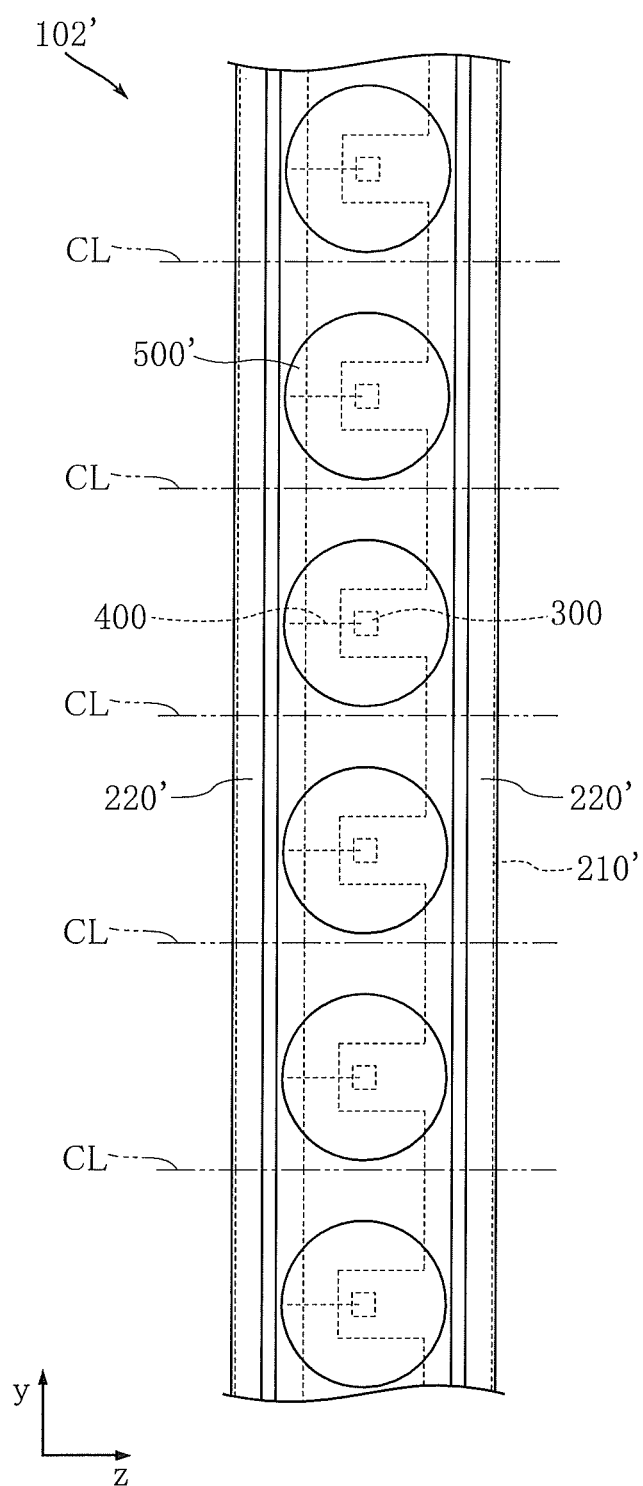
FIG. 19 is a plan view showing a step of a process for making the semiconductor light-emitting device of FIG. 17.

The semiconductor light-emitting device 102 of this embodiment can be manufactured by a process similar to the above-described process for manufacturing the semiconductor light-emitting device 101. FIG. 19 shows a semiconductor light-emitting device aggregate member 102' including a base aggregate board 210', conductor patterns 220', LED chips 300, wires 400, and a resin mold 500'. (Hereinafter, this aggregate member, which corresponds to the aggregate member 101' shown in FIG. 14, is referred to as aggregate member 102'). The aggregate member 102' is cut along x-y plane at predetermined intervals in the direction y. In this embodiment, the aggregate member is cut at positions indicated by cutting lines CL in FIG. 19.

Figure 20:
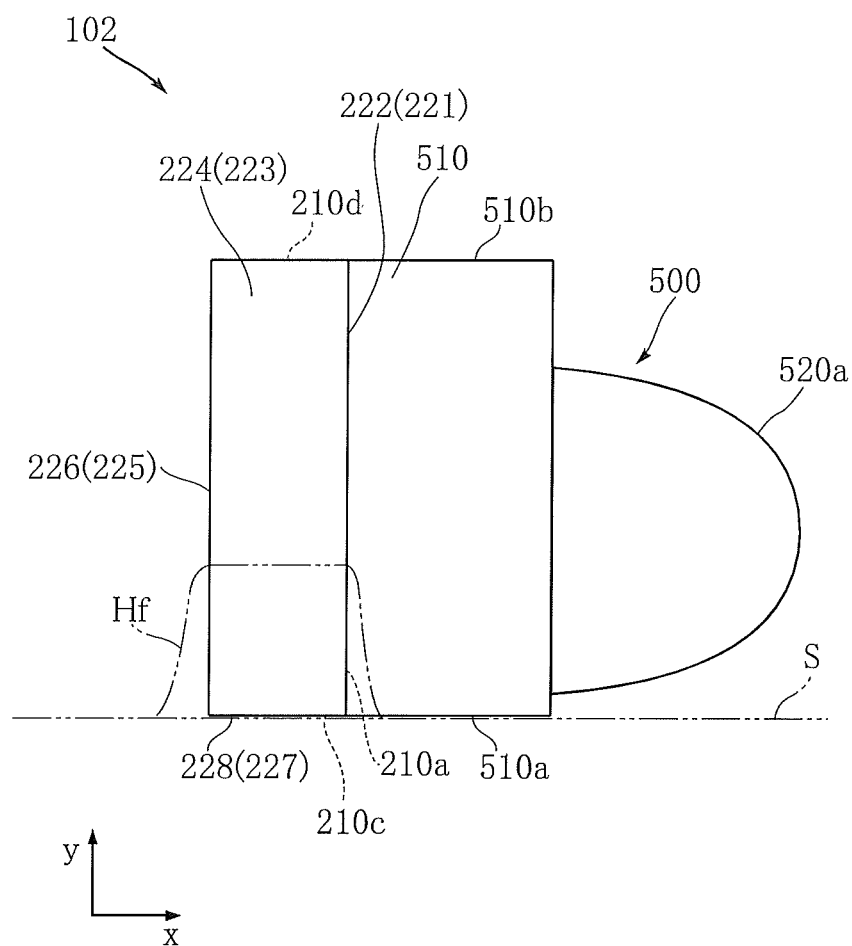
FIG. 20 is a side view showing an example of the state in which the semiconductor light-emitting device of FIG. 17 is mounted on a circuit board.

As shown in FIG. 20, when the semiconductor light-emitting device 102 is used as a side view type light source, it is mounted with the side surface 210c, toward which the lens 520a is offset, facing the circuit board S. Thus, the center of gravity in the mounted state is positioned at a lower position (closer to the circuit board S) as compared with that in the first embodiment (see FIG. 16). Thus, according to the semiconductor light-emitting device 102, the posture is more stabilized when mounted as a side view type.

Figure 21:
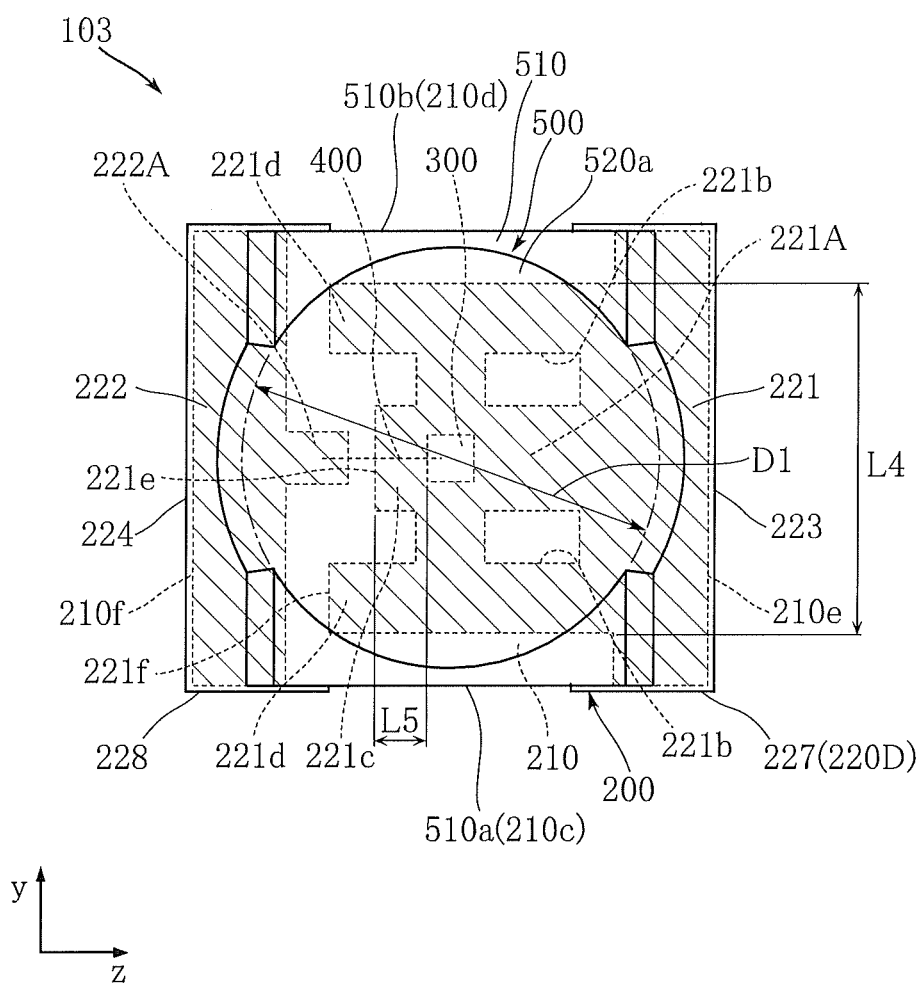
FIG. 21 is a plan view of a semiconductor light-emitting device according to a third embodiment the present invention.

FIG. 21 shows a semiconductor light-emitting device according to a third embodiment of the present invention. The semiconductor light-emitting device 103 of this embodiment differs from the foregoing embodiments in shape of the bonding portions 221, 222. In this embodiment, the bonding portion 221 has an extension 221A (first extension) extending from the first side (right side in this figure) toward the second side (left side in this figure) in the direction z, and the LED chip 300 is mounted on the extension 221A. For easier understanding, the region where the bonding portions 221, 222 are formed is indicated by upper left to lower right hatching in FIG. 21. Also in FIGS. 22-24 which will be described later, the region where the bonding portions 221, 222 are formed is indicated by upper left to lower right hatching.

The extension 221A has a relatively large length L4 in the direction y. The length L4 of the extension 221A is not less than one half or preferably not less than three fourths the length of the base 210 in the direction y.

The extension 221A has openings 221b penetrating in the thickness direction (direction x). In this embodiment, the extension 221A has a plurality of (two) openings 221b spaced apart from each other. The openings 221b are provided on the first side of the LED chip 300 in the direction z. As will be understood from e.g. FIG. 3, at a region where the extension 221A is provided, the resin package 500 covering the upper surface of the base 210 is in close contact with the surface of the extension 221A. On the other hand, at the regions where the openings 221b are provided, the resin package 500 is in close contact with the surface of the base 210.

The extension 221A includes a projection 221c and a pair of projections 221d. The projection 221c projects from the center in the direction y toward the second side in the direction z and overlaps the LED chip 300 as viewed in the direction z. The length L5 of the projection 221c from the LED chip 300 to the front end 221e on the second side in the direction z is relatively long. For instance, the length L5 is about 0.2-0.6 mm or preferably about 0.3-0.6 mm. When described with reference to the size of the LED chip 300, the length L5 is not less than the length of the LED chip 300 in the direction y or preferably 1-2.5 times or more preferably 1.5-2.5 times the length of the LED chip 300.

Each projection 221d projects from each end in the direction y toward the second side in the direction z. The front end 221f of the projection 221d on the second side in the direction z is on the second side (left side in the figure) of the front end 221e of the projection 221c in the direction z.

The bonding portion 222 has an extension 222A (second extension) extending from the second side (left side in this figure) toward the first side (right side in this figure) in the direction z. The extension 222A is positioned at the center in the direction y and has a relatively small length in the direction y. The wire 400, one end of which is bonded to the LED chip 300, is bonded at the other end onto the extension 222A.

In this embodiment, the diameter D1 of the lens 520a (the diameter at the portion where the upper surface of the foundation portion 510 meets the lens 520a) is relatively large, and not less than six times or preferably not less than eight times the length of a side of the LED chip 300 (longer side when the LED chip 300 is in the form of an elongated rectangle) as viewed in the direction x.

The semiconductor light-emitting device 103 of this embodiment has the following advantages, in addition to the advantages described above as to the first embodiment. In this embodiment, the LED chip 300 is mounted on the extension 221A. Heat generated from the LED chip 300 during the lighting of the LED chip 300 is transferred through the extension 221A made of metal layers to the detour portion 223 and the mount portion 225, and dissipated to e.g. the circuit board on which the mount portion 225 is mounted. Since the length L4 of the extension 221A in the direction y is relatively long, a large heat transfer path is secured for the heat from the LED chip 300. According to this arrangement, heat from the LED chip 300 is efficiently dissipated to the outside, and good head dissipation ability is provided.

Epoxy resin or silicone resin forming the resin package 500 has higher adhesion to the glass epoxy resin forming the base 210 than to the surface of the extension 221A (Au as the conductive layer 220C shown in e.g. FIG. 4). In this embodiment, the extension 221A has openings 221b penetrating in the thickness direction and arranged as dispersed, and the resin package 500 is in close contact with the surface of base 210 through the openings 221b. According to this arrangement having openings 221b, the resin package 500 and the base 210 are held in close contact with each other at a sufficiently large area. This arrangement prevents detachment of the resin package 500 due to heat during the lighting of the LED chip 300.

In the extension 221A, the length L5 from the LED chip 300 to the front end 221e on the second side in the direction z is made relatively long. Further, the openings 221b are provided on the first side of the LED chip 300 in the direction z. Thus, the extension 221A is provided at a relatively large area around the LED chip 300. Thus, the heat generated from the LED chip 300 is smoothly transferred toward the detour portion 223 through the region of the extension 221A around the LED chip 300. This is desirable for enhancing heat dissipation.

Figure 22:
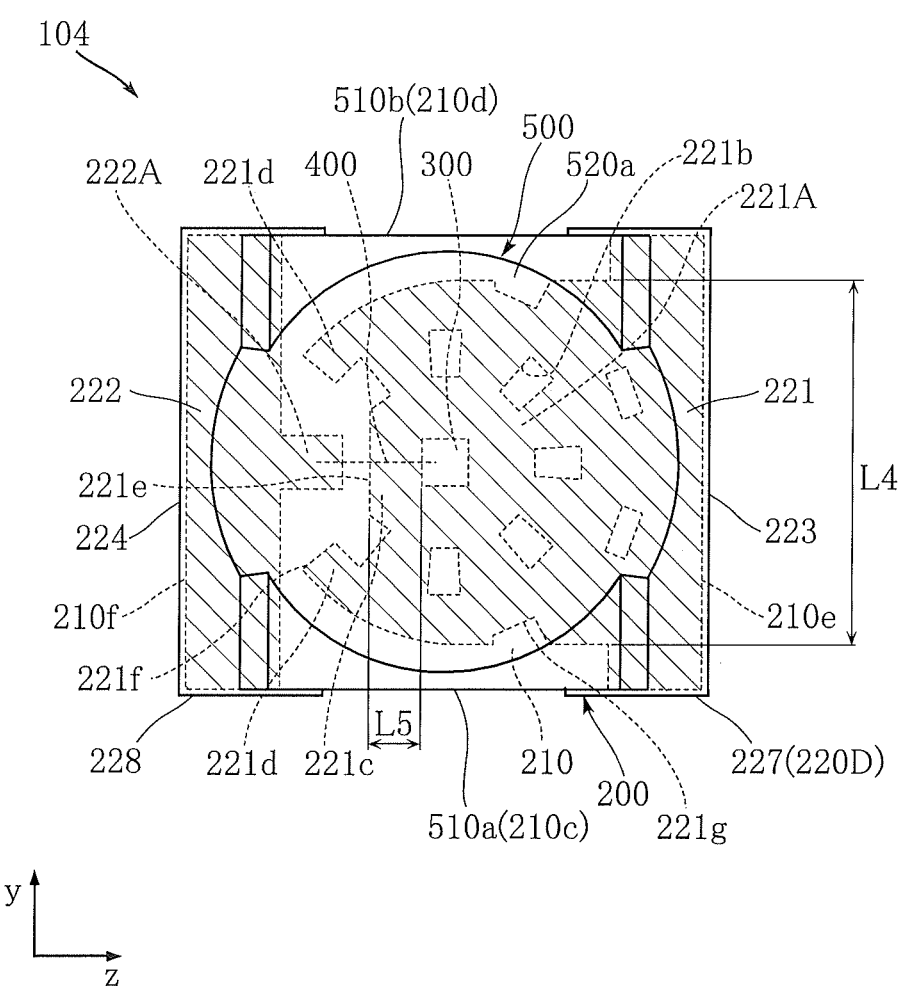
FIG. 22 is a plan view of a semiconductor light-emitting device according to a fourth embodiment the present invention.

FIG. 22 shows a semiconductor light-emitting device according to a fourth embodiment of the present invention. The semiconductor light-emitting device 104 of this embodiment differs from the foregoing embodiments in shape of the bonding portions 221, 222. Although the bonding portions 221, 222 of this embodiment have extensions 221A, 222A similarly to the third embodiment, the shapes of the extensions 221A, 222A are different from those of the third embodiment.

In this embodiment, similarly to the third embodiment, the length L4 of the extension 221A in the direction y is made relatively long. The extension 221A has a plurality of openings 221b arranged on a circle around the LED chip 300 at predetermined intervals. The extension 221A also has cuts 221g at appropriate positions. Providing the openings 221b and the cuts 221g as dispersed in this way is desirable for enhancing the adhesion of the resin package 500.

The extension 221A has projections 221d each projecting from each end in the direction y toward the second side in the direction z. The projection 221d extends along a circle around the LED chip 300.

Since the semiconductor light-emitting device 104 of this embodiment has the extension 221A having a long length L4 in the direction y, the light-emitting device has good heat dissipation ability similarly to the third embodiment. Moreover, since the provision of the openings 221b and the cuts 221g allows the resin package 500 and the base 210 to be in close contact with each other at a sufficiently large area, problems such as detachment of the resin package 500 are avoided.

Figure 23:
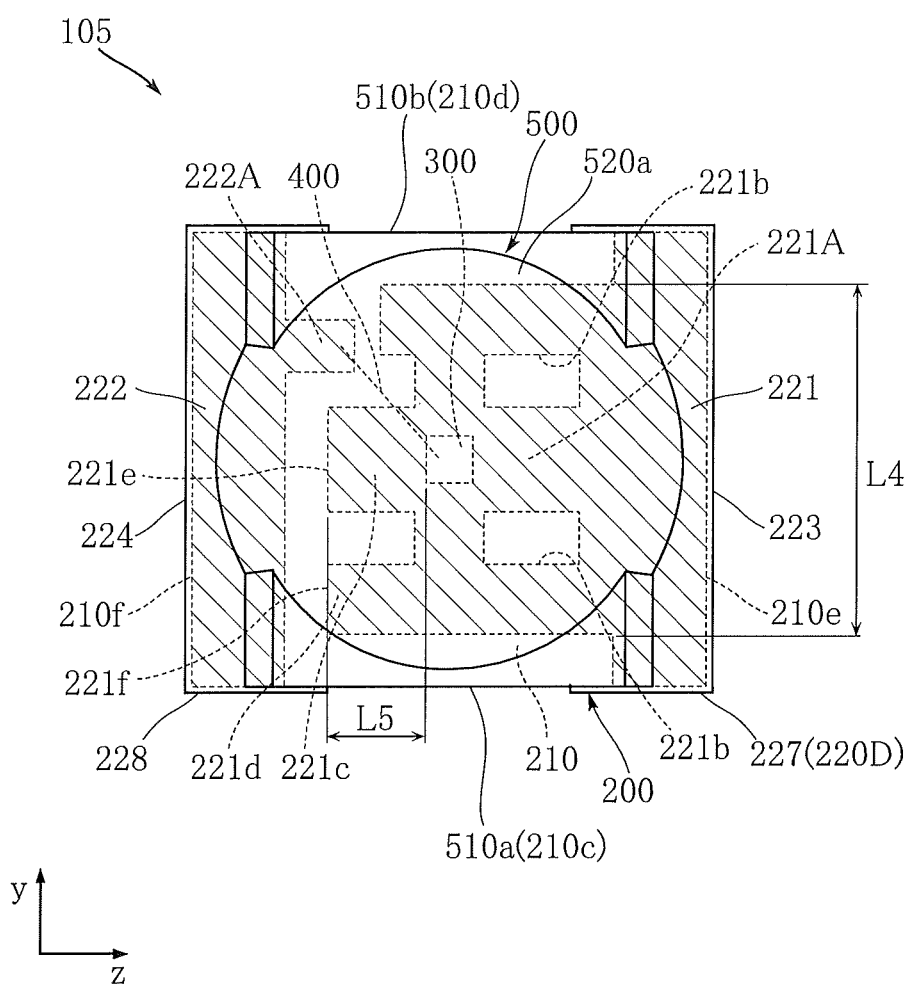
FIG. 23 is a plan view of a semiconductor light-emitting device according to a fifth embodiment the present invention.

FIG. 23 shows a semiconductor light-emitting device according to a fifth embodiment of the present invention. The semiconductor light-emitting device 105 of this embodiment differs from the foregoing embodiments in shape of the bonding portions 221, 222. Although the bonding portions 221, 222 of this embodiment have extensions 221A, 222A similarly to the third embodiment, the shapes of the extensions 221A, 222A are different from those of the third embodiment.

In this embodiment, similarly to the third embodiment, the length L4 of the extension 221A in the direction y is made relatively long. The openings 221b are formed at the same positions as those in the third embodiment, but the length L5 from the LED chip 300 to the front end 221e of the projection 221c is made longer. Since the length L5 is long, the extension 222A is provided at a position deviated toward one side in the direction y so as not to overlap the LED chip 300 as viewed in the direction z.

Since the semiconductor light-emitting device 105 of this embodiment has the extension 221A having a long length L4 in the direction y, the light-emitting device has good heat dissipation ability similarly to the third embodiment. Moreover, since the provision of the openings 221b allows the resin package 500 and the base 210 to be in close contact with each other at a sufficiently large area, problems such as detachment of the resin package 500 are avoided.

Figure 24:
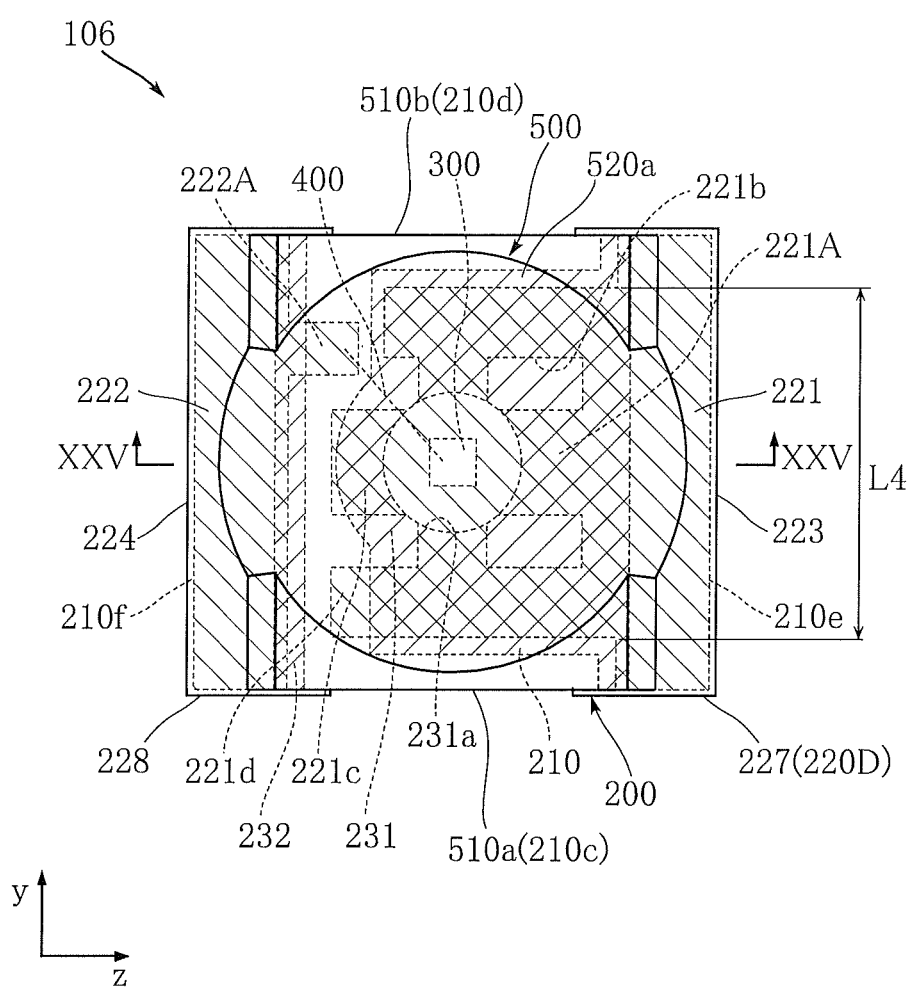
FIG. 24 is a plan view of a semiconductor light-emitting device according to a sixth embodiment the present invention.

FIG. 24 shows a semiconductor light-emitting device according to a sixth embodiment of the present invention. In the semiconductor light-emitting device 106 of this embodiment, the shapes of the bonding portions 221, 222 are the same as those of the semiconductor light-emitting device 105 of the fifth embodiment. However, the semiconductor light-emitting device of this embodiment differs from the semiconductor light-emitting device 105 in that it includes resist films 231, 232.

Figure 25:
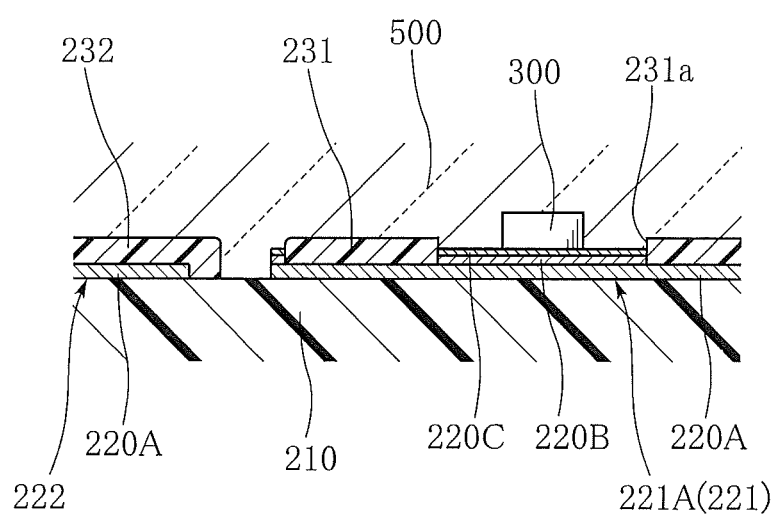
FIG. 25 is a sectional view taken along lines XXV-XXV in FIG. 24.

As shown in FIG. 25, the resist films 231, 232 are interposed between the bonding portions 221,222 and the resin package 500. The resist film 231 covers the bonding portion 221, and the resist film 232 covers the bonding portion 222. The resist film 231 has an opening 231a for exposing part of the bonding portion 231. The opening 231a is positioned at the center of the upper surface of the base 210. For easier understanding, the region where the resist films 231, 232 are formed is indicated by lower left to upper right hatching in FIG. 24.

As described above with reference to FIG. 4 and so on, when the bonding portions 221, 222 (wiring pattern 220) include conductive layers 220A, 220B and 220C, the formation of conductive layers 220A, 220B, 220C and resist films 231, 232 is performed in the order of first the conductive layer 220A, then the resist films 231 and 232, then the conductive layer 220B and then the conductive layer 220C. The region where the conductive layer 220A is formed corresponds to the region where the bonding portions 221, 222 are formed (see FIG. 24). As will be understood from FIGS. 24 and 25, each resist film 231, 232 covers a conductive layer 220A made of Cu in such a manner as to expose part of the conductive layer 220A. Further, each resist film 231, 232 covers part of the base 210. Here, an opening 231a is formed in the resist film 231. The conductive layer 220B made of Ni and the conductive layer 220C made of Au are formed on the exposed portion of the conductive layer 220A. In this embodiment, the conductive layers 220B, 220C are formed in the opening 231a and at the portion of the bonding portion 222 which is to become the extension 222A. In this way, extensions 221A, 222A are formed. The LED chip 330 is mounted on the extension 221A to face the opening 231a.

Since the semiconductor light-emitting device 108 of this embodiment has the extension 221A having a long length L4 in the direction y, the light-emitting device has good heat dissipation ability similarly to the third embodiment. In this embodiment, resist films 231, 232 are interposed between the bonding portions 221, 222 and the resin package 500. The resist films 231, 232 have higher adhesion to the resin package 500 than that of Au forming the conductive layer 220C. Thus, the provision of the resist films 231, 232 is desirable for enhancing the adhesion of the resin package 500. Moreover, in this embodiment, the area where the conductive layer 220C is formed is substantially small. This arrangement reduces the use of Au which forms the conductive layer 220C.

Figure 26:
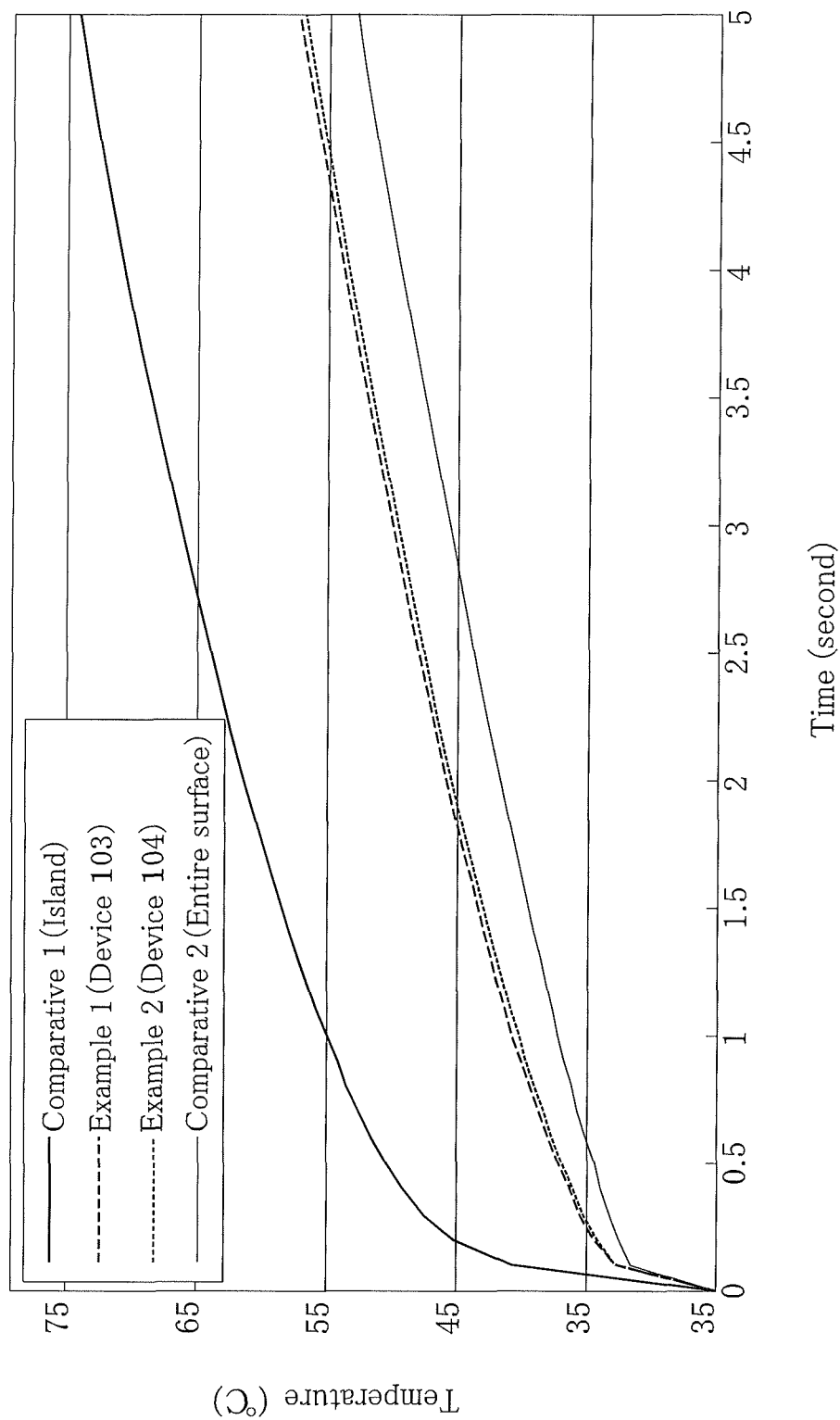
FIG. 26 is a graph showing the results of simulation analysis performed with respect to the heat dissipation ability of semiconductor light-emitting devices.

FIG. 26 is a graph showing the results of simulation analysis performed with respect to the heat dissipation ability of semiconductor light-emitting devices. The graph of FIG. 26 shows temperature histories after the start of lighting with respect to the maximum reaching temperature of the LED chip mount portion, in the case where a plurality of kinds of semiconductor light-emitting devices which differ from each other only in shape of the bonding portion on which the LED chip is mounted are lit. Examples 1 and 2 show the case of the semiconductor light-emitting device 103 of the third embodiment and the case of the semiconductor light-emitting device 104 of the fourth embodiment, respectively. In Comparative Example 1, the LED chip mount portion is in the form of a small island, and a conductive portion having a small width extends from the mount portion toward a detour portion. In Comparative Example 2, which is a hypothetical model for comparison, the bonding portion is provided on the entire upper surface of the base.

As shown in the temperature histories in FIG. 26, Comparative Example 1 reaches a considerably high temperature as compared with Examples 1, 2 and Comparative Example 2. Thus, the durability of Comparative Example 1 is considered to be low. Providing the bonding portion on the entire upper surface of the base 1 like Comparative Example 2 cannot be realized, because DC current cannot be applied to the LED chip. However, this structure provides an ideal level of heat dissipation ability because the size of the bonding portion contributing to heat dissipation is the maximum. However, since adhesion of the bonding portion to the resin package is poor, problems such as detachment of the resin package easily occur in the structure of Comparative Example 2.

Examples 1 and 2 have only small temperature difference from Comparative Example 2 and show good heat dissipation ability. Further, since Examples 1 and 2 (semiconductor light-emitting devices 103 and 104 of the third and the fourth embodiments) have better adhesion than Comparative Example 2 owing to the provision of the openings 221b, enhanced durability is expected.

The semiconductor light-emitting device of the present invention is not limited to the foregoing embodiments. The specific structure of each part of the semiconductor light-emitting device according to the present invention can be varied in design in many ways.

In the foregoing embodiments, the mount portions 227, 228 (second mount portion) are arranged in such a manner as to substantially avoid the side surface 210c (first side surface) of the base 210 to expose the first side surface generally entirely. However, the present invention is not limited to this arrangement. For instance, the second mount portion may cover a relatively large region of the first side surface.

Although the materials for the conductive layers 220A, 220B, 220C constituting the wiring pattern 200 are exemplarily described in the foregoing embodiments, the present invention is not limited to this. For instance, as to the material for the conductive layer 220C that comes into contact with the resin package 500, Ag may be used instead of Au for enhancing adhesion to the resin package 500.

Although the foundation portion is provided in the foregoing embodiments, the foundation portion may not be provided. In this case, as to the portions other than the foundation portion, the structure of the foregoing embodiments can be applied. Also in the structure that does not include the foundation portion, the diameter of the lens is not less than six times or preferably not less than eight times the length of a side of the LED chip as viewed in the direction x.

When the foundation portion is provided, the height of the foundation portion can be made smaller than that in the foregoing embodiment. In the foregoing embodiment, the length L2 from the lower surface 210b of the base 210 to the end of the foundation portion 510 on the first side in the direction x is not less than one half the length L1 from the lower surface 210b to the center of the lens 520a. However, the length L2 may be less than one half the length L1. Even in this case, the provision of the foundation portion prevents the light-emitting device from falling when mounted as a side view type.

The invention claimed is:

1. A semiconductor light-emitting device comprising:
   a substrate including a base and a wiring pattern formed on the base, the base including a first primary surface, a second primary surface and a first side surface, the first primary surface and the second primary surface being spaced apart from each other in a first direction, the first side surface being connected to both the first primary surface and the second primary surface;
   an LED chip mounted on the first primary surface of the base; and
   a resin package covering the LED chip and including a lens and a foundation portion, the lens being positioned in front of the LED chip, the foundation portion being closer to the substrate than the lens is in the first direction;
   wherein the foundation portion includes a first foundation portion side surface that is flush with the first side surface of the base, and
   wherein the foundation portion includes an end edge spaced apart from the substrate in the first direction, and a length from the second primary surface to the end edge of the foundation portion is not less than one half a length from the second primary surface to a center of the lens.

2. The semiconductor light-emitting device according to claim 1, wherein the wiring pattern extends from the first primary surface and onto the second primary surface.

3. The semiconductor light-emitting device according to claim 1, wherein the wiring pattern includes a first portion and a second portion formed on the first primary surface and the second primary surface, respectively, and each of the first portion and the second portion of the wiring pattern extends at least to an edge of the first side surface of the base.

4. The semiconductor light-emitting device according to claim 1, wherein the first primary surface and the second primary surface are parallel to each other, and the first side surface faces in a second direction perpendicular to the first direction, and
   wherein the wiring pattern includes a pair of first mount portions and a pair of second mount portions, the first mount portions being formed on the second primary surface and spaced apart from each other in a third direction perpendicular to both the first direction and the second direction, the second mount portions facing in the second direction, being spaced apart from each other in the third direction, and protruding beyond the first side surface in the second direction.

5. The semiconductor light-emitting device according to claim 1, wherein a thickness of the foundation portion in the first direction is larger than a thickness of the base in the first direction.

6. The semiconductor light-emitting device according to claim 1, wherein a center of gravity of an entirety including the substrate, the LED chip and the resin package is closer to the substrate than a middle point between the second primary surface and a top of the lens is.

7. The semiconductor light-emitting device according to claim 6, wherein the base includes a second side surface spaced apart from the first side surface in a second direction perpendicular to the first direction, the second side surface being parallel to the first side surface, and
   wherein as viewed in the first direction, a center of the lens is offset in the second direction from a middle point between the first side surface and the second side surface.

8. The semiconductor light-emitting device according to claim 1, wherein the base includes a second side surface spaced apart from the first side surface in a second direction perpendicular to the first direction, the second side surface being parallel to the first side surface, and the foundation portion includes a second foundation portion side surface parallel to the first foundation portion side surface.

9. The semiconductor light-emitting device according to claim 8, wherein the second foundation portion side surface is flush with the second side surface of the base.

10. The semiconductor light-emitting device according to claim 4, wherein the wiring pattern includes a pair of bonding portions formed on the first primary surface, the LED chip being mounted on one of the bonding portions, and
    each of the bonding portions is electrically connected to a respective one of the first mount portions.

11. The semiconductor light-emitting device according to claim 10, wherein the base includes a third side surface and a fourth side surface that are spaced apart from each other in the third direction and parallel to each other, and
    the wiring pattern includes a pair of detour portions connected to both the first mount portions and the bonding portions and formed on the third side surface and the fourth side surface, respectively.

12. The semiconductor light-emitting device according to claim 11, wherein the detour portions cover ends of the third side surface and the fourth side surface that are adjacent to the first side surface, and the first mount portions cover an end of the second primary surface that is adjacent to the first side surface.

13. The semiconductor light-emitting device according to claim 12, wherein the detour portions extend from ends of the third side surface and the fourth side surface that are adjacent to the first side surface to other ends of the third side surface and the fourth side surface in the second direction, and the first mount portions extend from an end of the second primary surface that is adjacent to the first side surface to another end of the second primary surface in the second direction.

14. The semiconductor light-emitting device according to claim 12, wherein the wiring pattern includes a conductive layer formed on the base, and a plating layer covering at least part of the conductive layer.

15. The semiconductor light-emitting device according to claim 14, wherein each of the detour portions and the first mount portions is provided by the conductive layer and the plating layer formed on the conductive layer.

16. The semiconductor light-emitting device according to claim 15, wherein the conductive layer providing each of the detour portions includes a first end surface adjacent to the first side surface, and the conductive layer providing each of the first mount portions includes a second end surface adjacent to the first side surface, and wherein the first end surface and the second end surface are covered by the plating layer.

17. The semiconductor light-emitting device according to claim 16, wherein the first end surface and the second end surface are flush with the first side surface, and the second mount portions include the plating layer covering the first end surface and the second end surface.

18. The semiconductor light-emitting device according to claim 17, wherein the plating layer covering the first end surface and the second end surface includes an edge that covers the first side surface.

19. The semiconductor light-emitting device according to claim 15, wherein the conductive layer contains Cu.

20. The semiconductor light-emitting device according to claim 10, wherein the bonding portions comprise a first bonding portion and a second bonding portion, the first bonding portion including a first extension extending in the third direction, the second bonding portion including a second extension extending in the third direction, and wherein the LED chip is mounted on the first extension.

21. The semiconductor light-emitting device according to claim 20, wherein a length of the first extension in the second direction is not less than one half a length of the base in the second direction.

22. The semiconductor light-emitting device according to claim 20, wherein the first extension is formed with a first opening penetrating through the first extension in the first direction, the first opening being offset with respect to the LED chip in the third direction.

23. The semiconductor light-emitting device according to claim 20, wherein the first extension includes a first projection overlapping the LED chip as viewed in the third direction and projecting toward the second bonding portion, and wherein a length from the LED chip to a front end of the first projection in the third direction is not less than a length of the LED chip in the second direction.

24. The semiconductor light-emitting device according to claim 23, wherein the first extension includes second projections flanking the first projection in the second direction and each projecting toward the second bonding portion.

25. The semiconductor light-emitting device according to claim 24, wherein in the third direction, a front end of each of the second projections is closer to the second bonding portion than the front end of the first projection is.

26. The semiconductor light-emitting device according to claim 20, further comprising a wire for connecting the LED chip and the second extension to each other.

27. The semiconductor light-emitting device according to claim 20, wherein the second extension is spaced apart from the LED chip as viewed in the third direction.

28. The semiconductor light-emitting device according to claim 20, further comprising a resist film disposed between the first bonding portion and the resin package, the resist film being formed with a second opening that exposes part of the first bonding portion, wherein the first extension includes a portion exposed through the second opening, and the LED chip is mounted on said portion of the first extension.

29. The semiconductor light-emitting device according to claim 1, wherein the lens includes an optical axis extending in the first direction and an aspheric surface having a curvature that decreases with increasing distance from a center of the lens toward a periphery of the lens.

30. The semiconductor light-emitting device according to claim 1, wherein the lens has a diameter not less than six times a length of a side of the LED chip as viewed in the first direction.

* * * * *